United States Patent
Sharangpani et al.

(10) Patent No.: US 11,877,446 B2
(45) Date of Patent: Jan. 16, 2024

(54) THREE-DIMENSIONAL MEMORY DEVICE WITH ELECTRICALLY CONDUCTIVE LAYERS CONTAINING VERTICAL TUBULAR LINERS AND METHODS FOR FORMING THE SAME

(71) Applicant: SANDISK TECHNOLOGIES LLC, Addison, TX (US)

(72) Inventors: Rahul Sharangpani, Fremont, CA (US); Raghuveer S. Makala, Campbell, CA (US); Fei Zhou, San Jose, CA (US); Adarsh Rajashekhar, Santa Clara, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 194 days.

(21) Appl. No.: 17/345,860

(22) Filed: Jun. 11, 2021

(65) Prior Publication Data

US 2022/0399354 A1      Dec. 15, 2022

(51) Int. Cl.
*H10B 41/35* (2023.01)
*H10B 41/10* (2023.01)
(Continued)

(52) U.S. Cl.
CPC ............ *H10B 41/35* (2023.02); *H10B 41/10* (2023.02); *H10B 41/27* (2023.02); *H10B 43/10* (2023.02); *H10B 43/27* (2023.02); *H10B 43/35* (2023.02)

(58) Field of Classification Search
CPC ........ H10B 41/35; H10B 41/10; H10B 41/27; H10B 43/10; H10B 43/27; H10B 43/35
See application file for complete search history.

(56) References Cited

U.S. PATENT DOCUMENTS 5,915,167 A * 6/1999 Leedy ...................... G11C 5/02
                                                         438/455
8,658,499 B2 * 2/2014 Makala ................. H10B 43/20
                                                         257/334

(Continued)

FOREIGN PATENT DOCUMENTS

WO    WO 2021-118627 A1    6/2021

OTHER PUBLICATIONS

Becker, J.S. et al., "Diffusion Barrier Properties of Tungsten Nitride Films Grown by Atomic Layer Deposition From bis(Tert-Butylimido)bis(Dimethylamido) Tungsten and Ammonia," Applied Physics Letters, vol. 82, No. 14, pp. 2239-2241, (2003); DOI:10.1063/1.1565699.

(Continued)

*Primary Examiner* — Kimberly N Rizkallah
*Assistant Examiner* — Pratiksha Jayant Lohakare
(74) *Attorney, Agent, or Firm* — THE MARBURY LAW GROUP PLLC

(57) ABSTRACT

A three-dimensional memory device includes an alternating stack of insulating layers and electrically conductive layers, memory openings vertically extending through the alternating stack, and memory opening fill structures located within the memory openings. Each of the electrically conductive layers includes a metallic fill material layer and a plurality of vertical tubular metallic liners laterally surrounding a respective one of the memory opening fill structures and located between the metallic fill material layer and a respective one of the memory opening fill structures. The tubular metallic liners may be formed by selective metal or metal oxide deposition, or by conversion of surface portions of the metallic fill material layers into metallic compound material portions by nitridation, oxidation, or incorporation of boron atoms.

2 Claims, 38 Drawing Sheets

(51) Int. Cl.
  *H10B 41/27* (2023.01)
  *H10B 43/10* (2023.01)
  *H10B 43/27* (2023.01)
  *H10B 43/35* (2023.01)

(56) References Cited

U.S. PATENT DOCUMENTS

| | | | | |
|---|---|---|---|---|
| 9,356,031 | B2* | 5/2016 | Lee | H01L 21/764 |
| 9,397,046 | B1 | 7/2016 | Sharangpani et al. | |
| 9,685,215 | B1* | 6/2017 | Kang | G11C 11/223 |
| 9,698,152 | B2 | 7/2017 | Peri et al. | |
| 9,748,174 | B1 | 8/2017 | Amano | |
| 9,780,182 | B2 | 10/2017 | Peri et al. | |
| 9,799,671 | B2 | 10/2017 | Pachamuthu et al. | |
| 10,068,630 | B2* | 9/2018 | Park | G11C 11/2275 |
| 10,229,931 | B1 | 3/2019 | Hinoue et al. | |
| 10,276,583 | B2 | 4/2019 | Sharangpani et al. | |
| 10,283,513 | B1 | 5/2019 | Zhou et al. | |
| 10,290,652 | B1* | 5/2019 | Sharangpani | H01L 21/76847 |
| 10,361,213 | B2 | 7/2019 | Sharangpani et al. | |
| 10,615,123 | B2 | 4/2020 | Hinoue et al. | |
| 10,700,093 | B1* | 6/2020 | Kalitsov | H01L 29/516 |
| 10,707,233 | B1 | 7/2020 | Cui et al. | |
| 10,811,431 | B1* | 10/2020 | Makala | H10B 51/20 |
| 10,818,542 | B2 | 10/2020 | Cui et al. | |
| 10,840,259 | B2 | 11/2020 | Rabkin et al. | |
| 10,868,042 | B1* | 12/2020 | Zhang | H01L 29/40111 |
| 2014/0087534 | A1* | 3/2014 | Choe | G11C 16/0466 |
| | | | | 438/270 |
| 2015/0318301 | A1* | 11/2015 | Lee | H10B 43/27 |
| | | | | 257/324 |
| 2016/0225866 | A1 | 8/2016 | Peri et al. | |
| 2016/0300848 | A1 | 10/2016 | Pachamuthu et al. | |
| 2017/0084532 | A1* | 3/2017 | Son | H01L 23/5226 |
| 2017/0263623 | A1* | 9/2017 | Zhang | H01L 21/02532 |
| 2017/0373079 | A1 | 12/2017 | Sharangpani et al. | |
| 2018/0033646 | A1 | 2/2018 | Sharangpani et al. | |
| 2018/0082729 | A1* | 3/2018 | Slesazeck | G11C 11/5657 |
| 2018/0166460 | A1* | 6/2018 | Manabe | H10B 43/27 |
| 2019/0139973 | A1 | 5/2019 | Zhou et al. | |
| 2019/0287916 | A1 | 9/2019 | Sharangpani et al. | |
| 2019/0287982 | A1 | 9/2019 | Hinoue et al. | |
| 2020/0051993 | A1 | 2/2020 | Rabkin et al. | |
| 2020/0227398 | A1* | 7/2020 | Oh | G11C 16/08 |
| 2020/0365618 | A1* | 11/2020 | Zhang | H10B 51/20 |
| 2020/0395310 | A1 | 12/2020 | Mukae et al. | |
| 2021/0082955 | A1 | 3/2021 | Rajashekhar et al. | |
| 2021/0090992 | A1 | 3/2021 | Li et al. | |
| 2021/0183883 | A1 | 6/2021 | Zhang et al. | |

OTHER PUBLICATIONS

Endoh et al., "Novel Ultra High Density Memory with a Stacked-Surrounding Gate Transistor (S-SGT) Structured Cell," IEDM Proc. (2001) 33-36.

Khojier, K. et al., "Annealing temperature effect on the mechanical and tribological properties of molybdenum nitride thin films," Journal of Nanostructure in Chemistry 2013, vol. 3, No. 5, pp. 1-7, (2013); DOI: 10.1186/2193-8865-3-5.

U.S. Appl. No. 16/801,456, filed Feb. 26, 2020, SanDisk Technologies LLC.

U.S. Appl. No. 17/000,934, filed Aug. 24, 2020, SanDisk Technologies LLC.

U.S. Appl. No. 17/155,541, filed Jan. 22, 2021, SanDisk Technologies LLC.

U.S. Appl. No. 17/244,186, filed Apr. 29, 2021, SanDisk Technologies LLC.

U.S. Appl. No. 17/345,831, filed Jun. 11, 2021, SanDisk Technologies LLC.

ISR—Notification of Transmittal of The International Search Report and Written Opinion of the International Searching Authority for International Patent Application No. PCT/US2021/065375, dated Apr. 25, 2022, 11 pages.

* cited by examiner

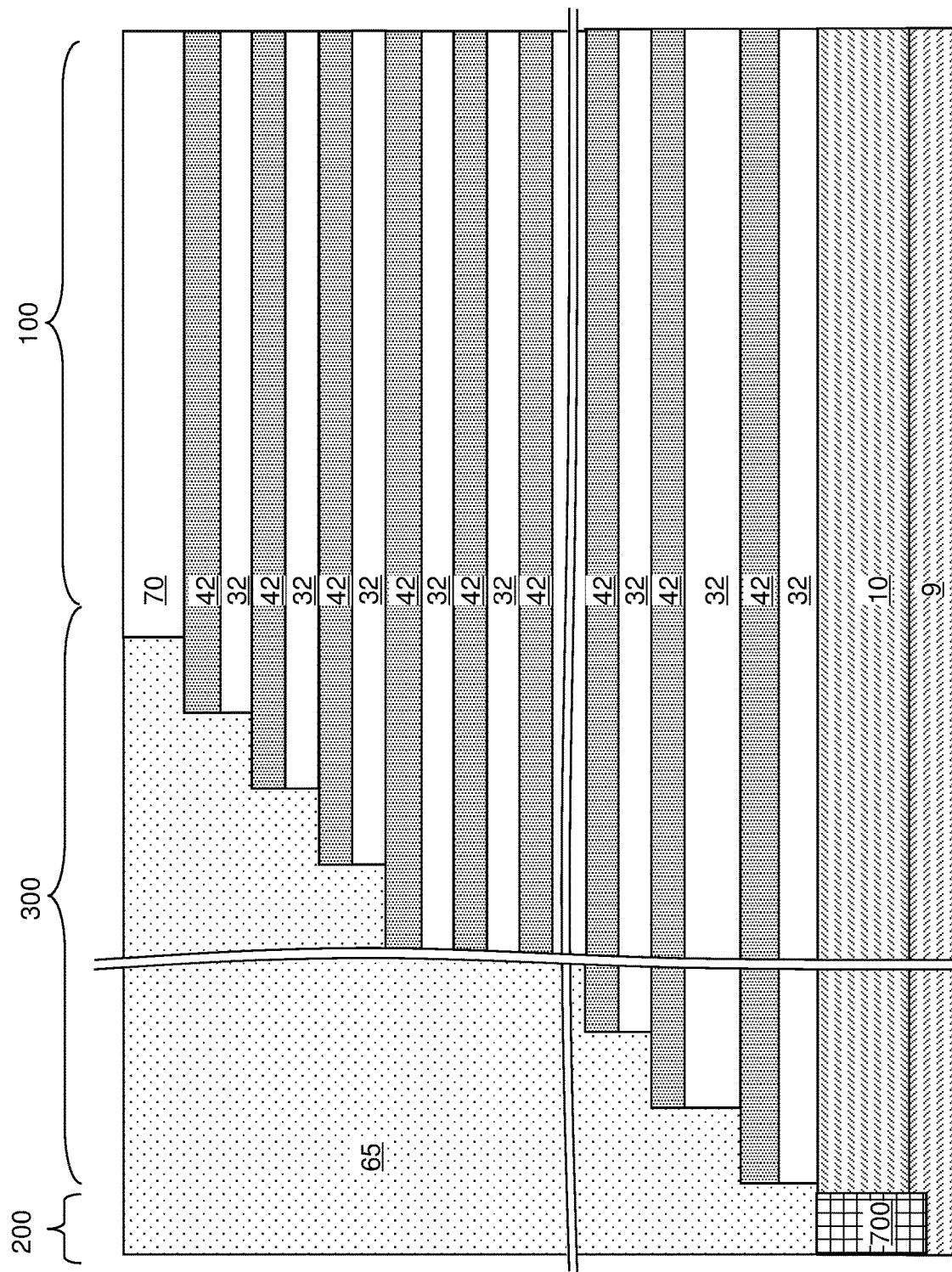

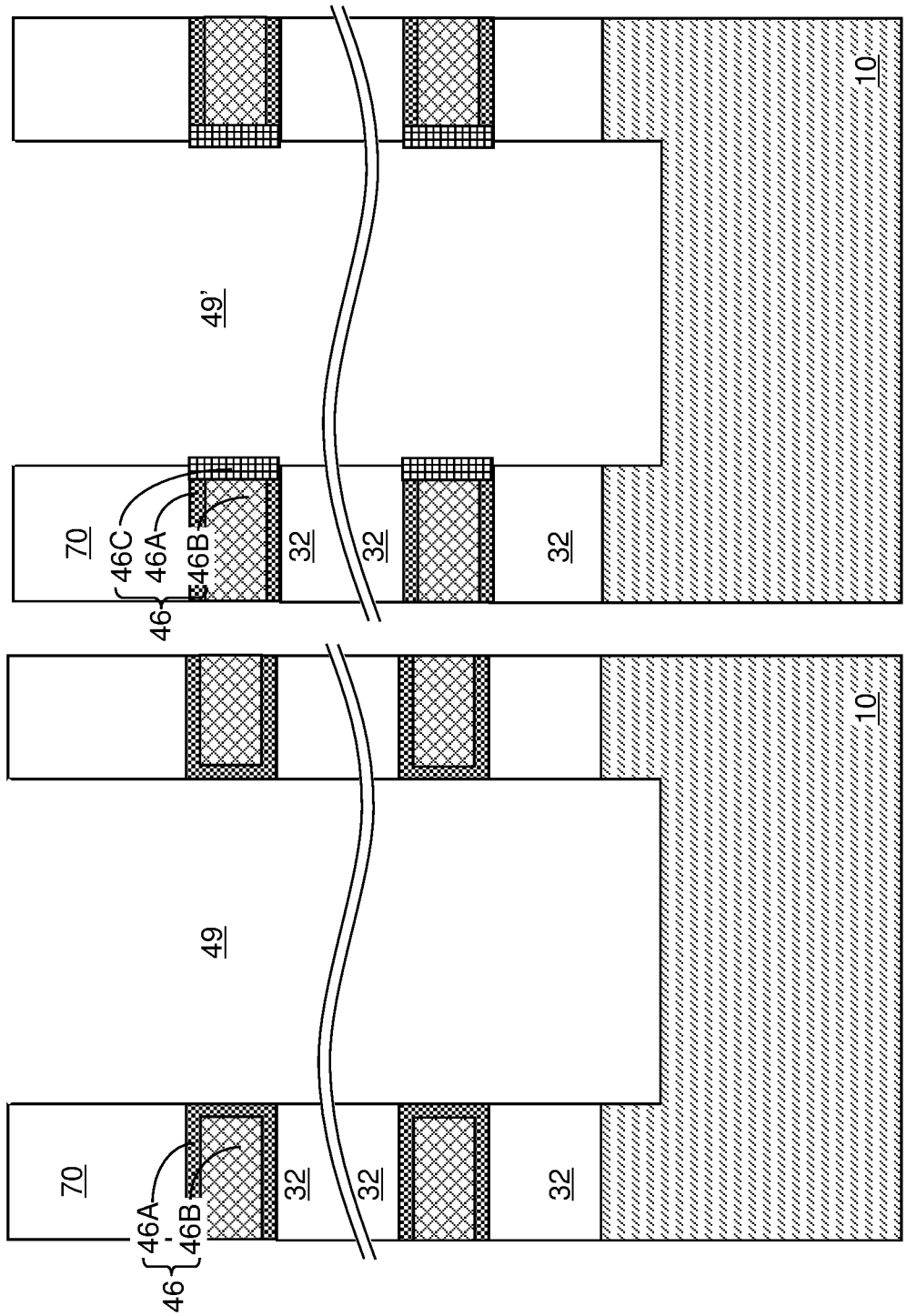

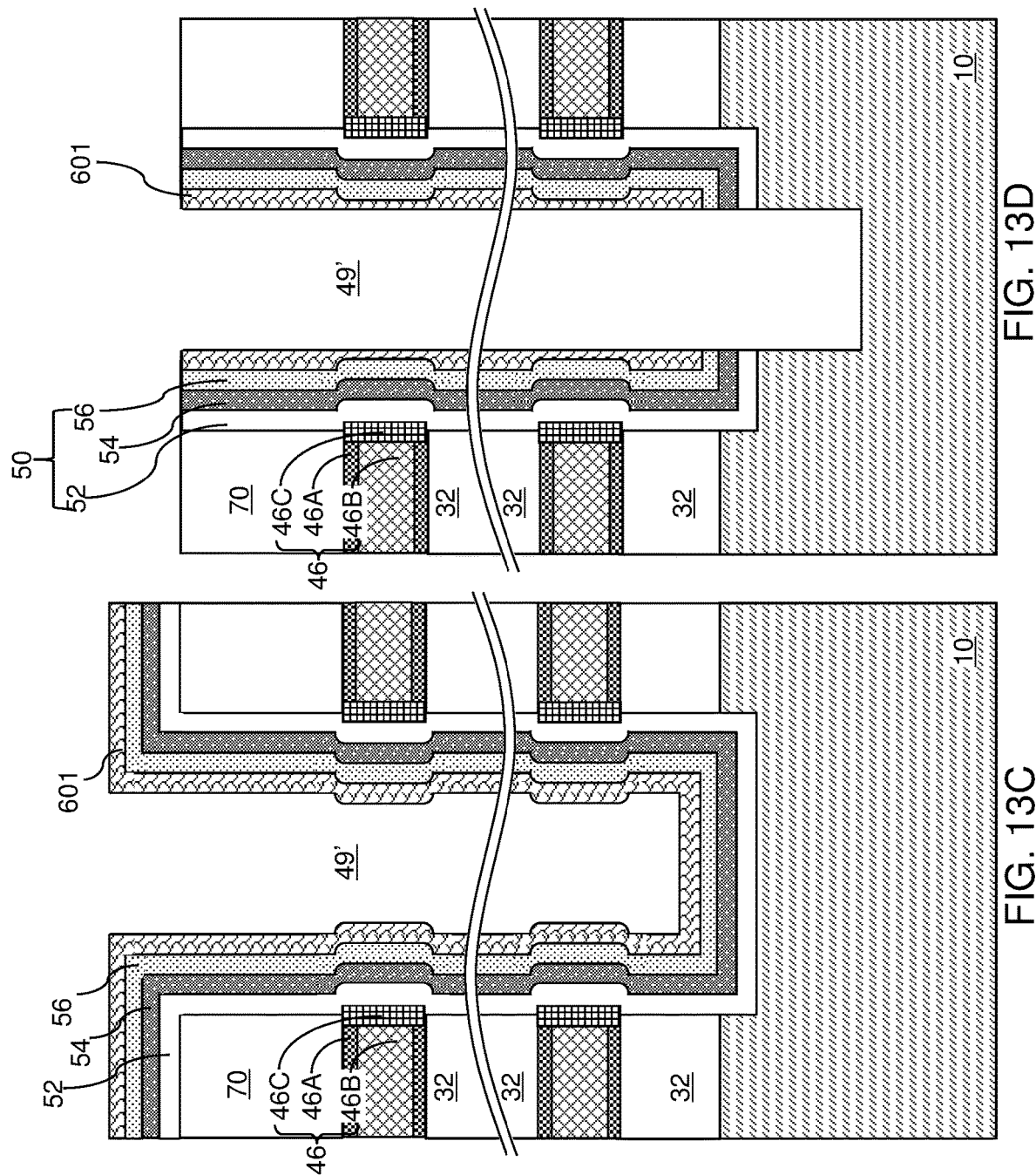

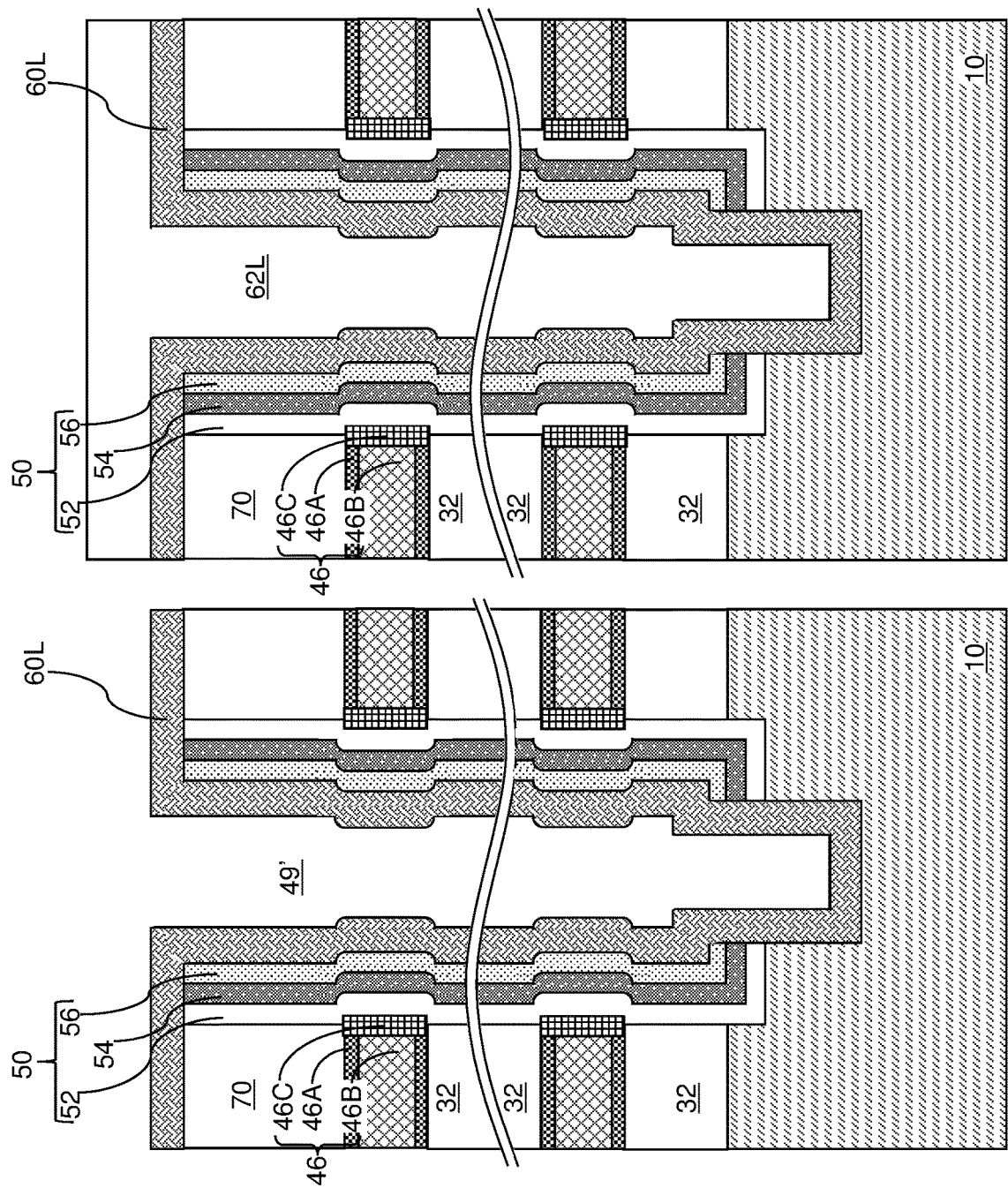

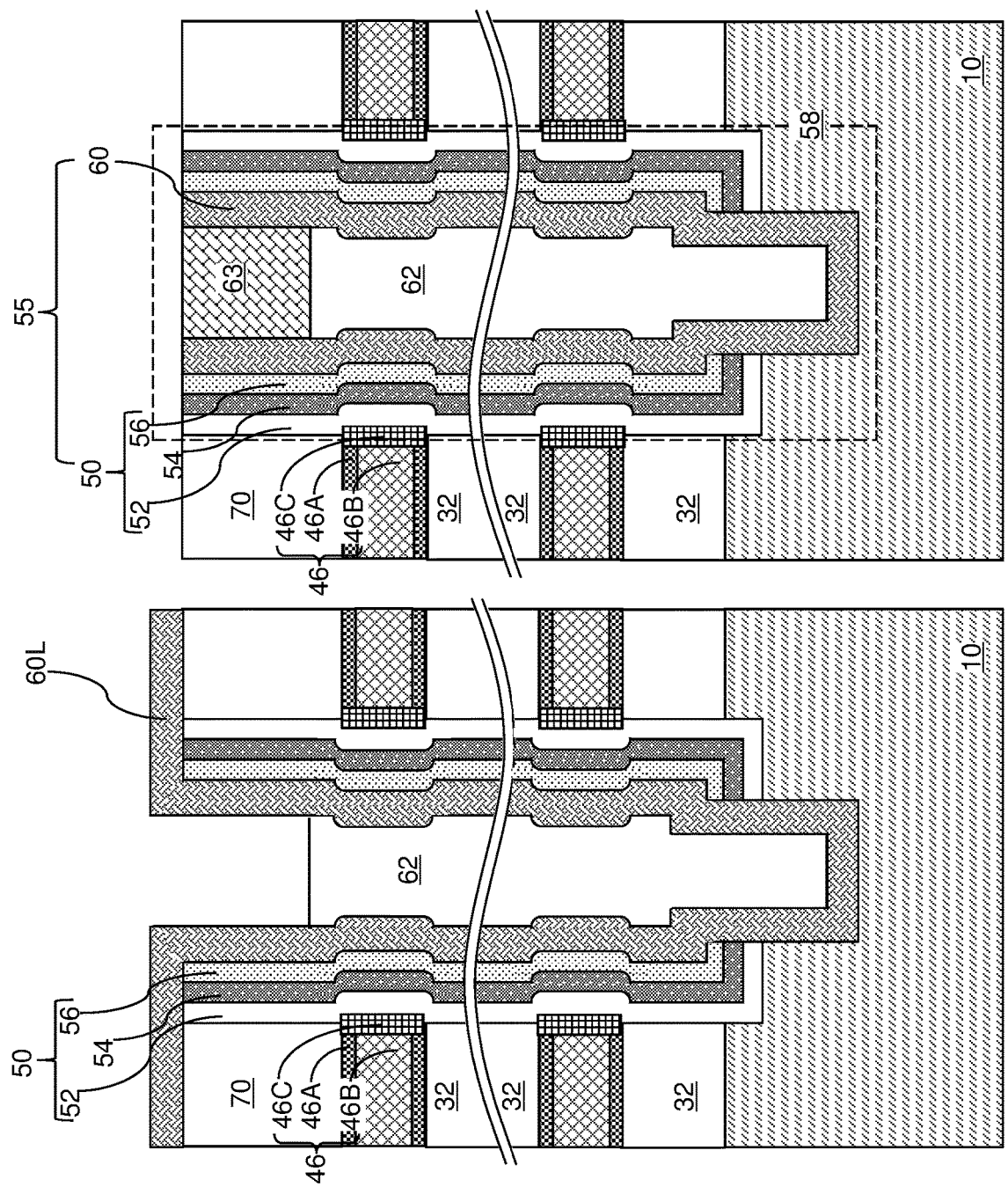

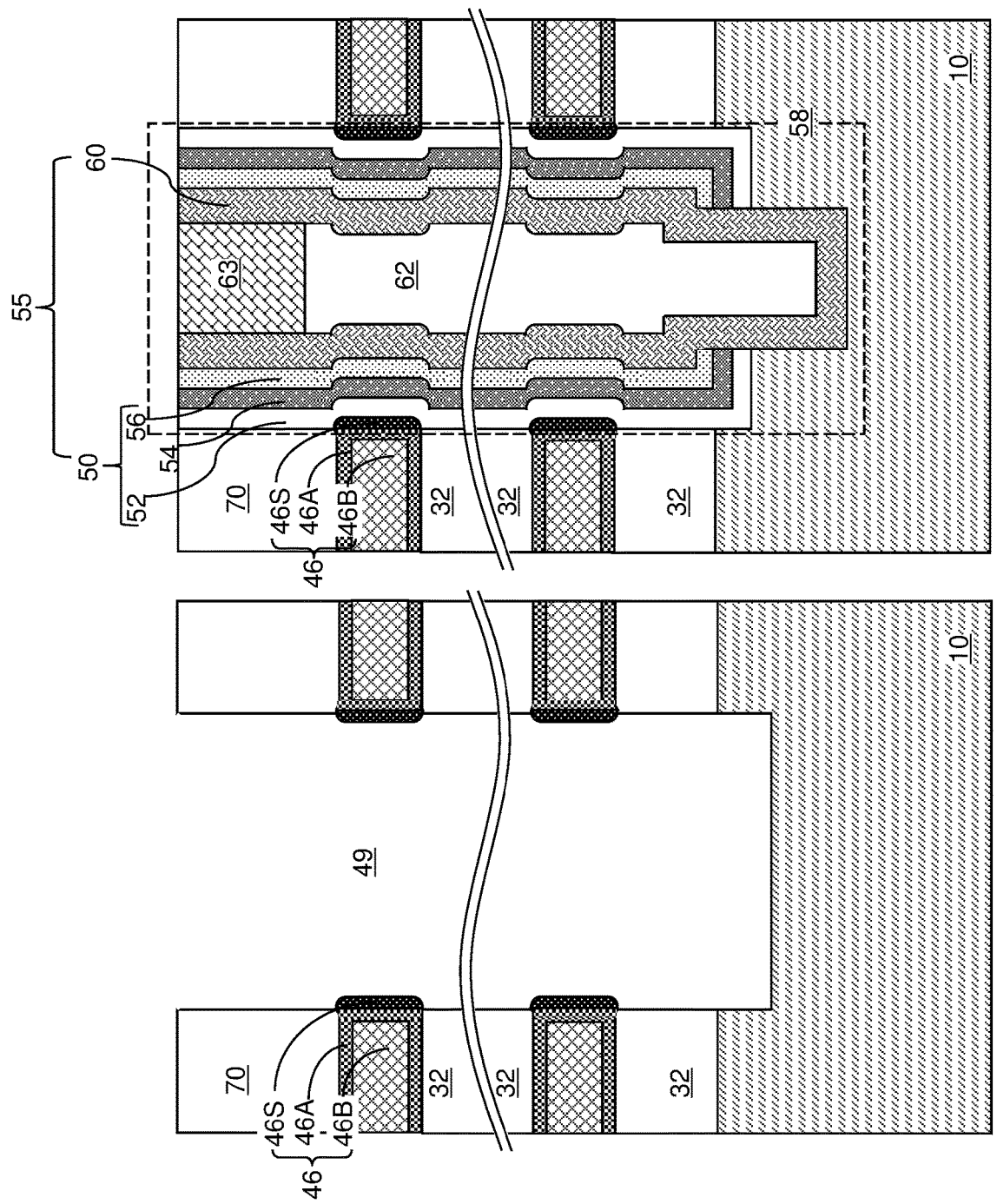

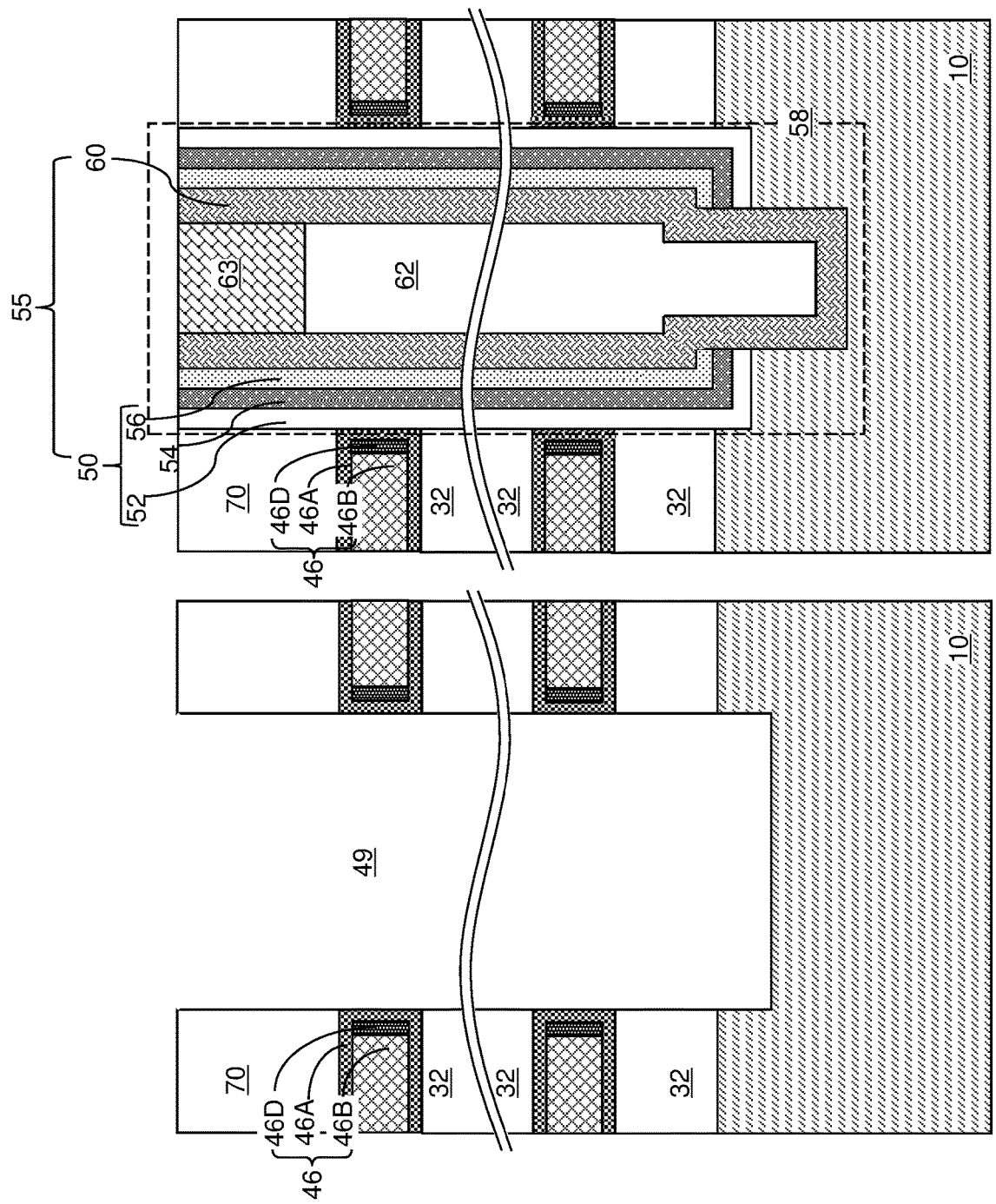

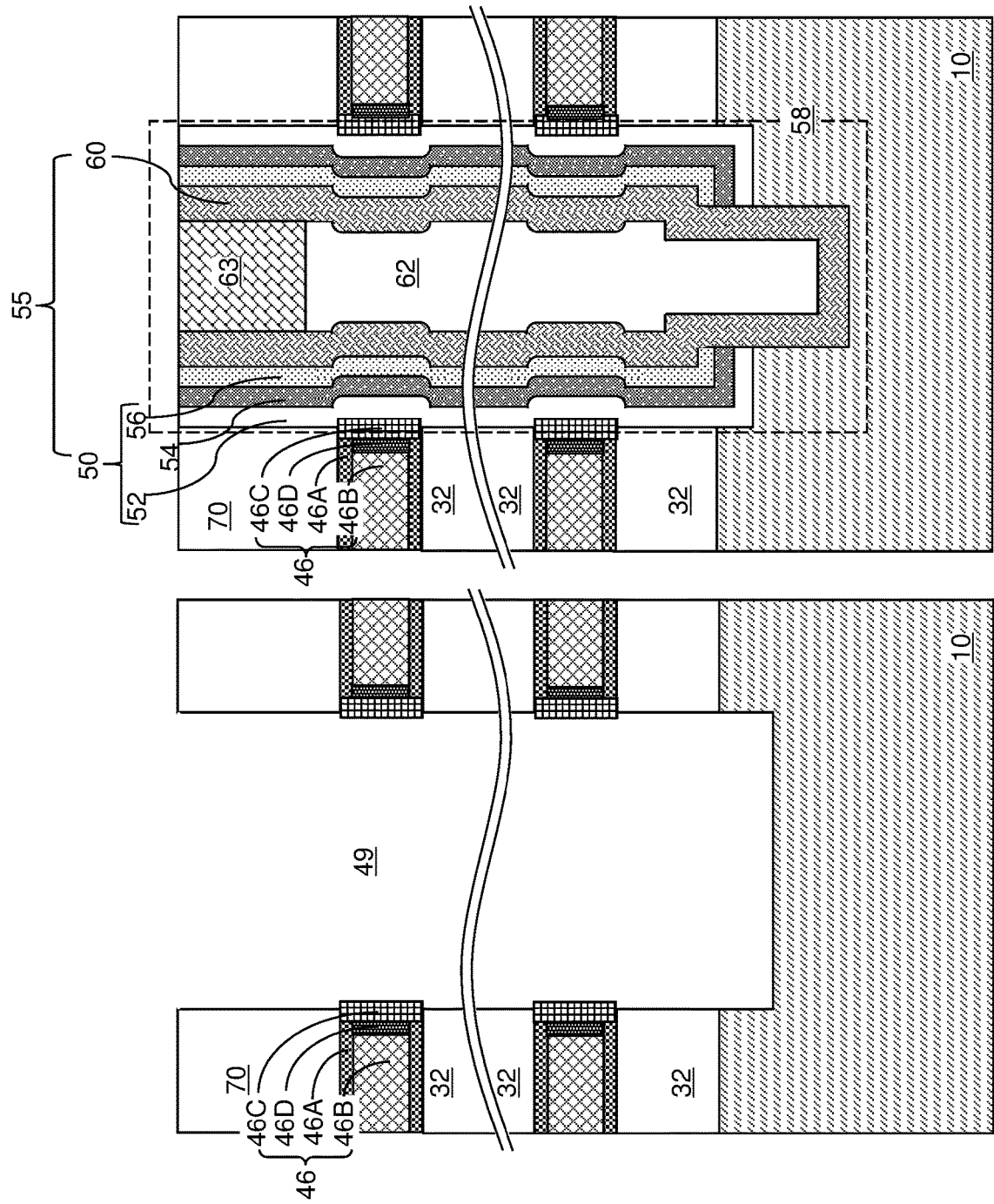

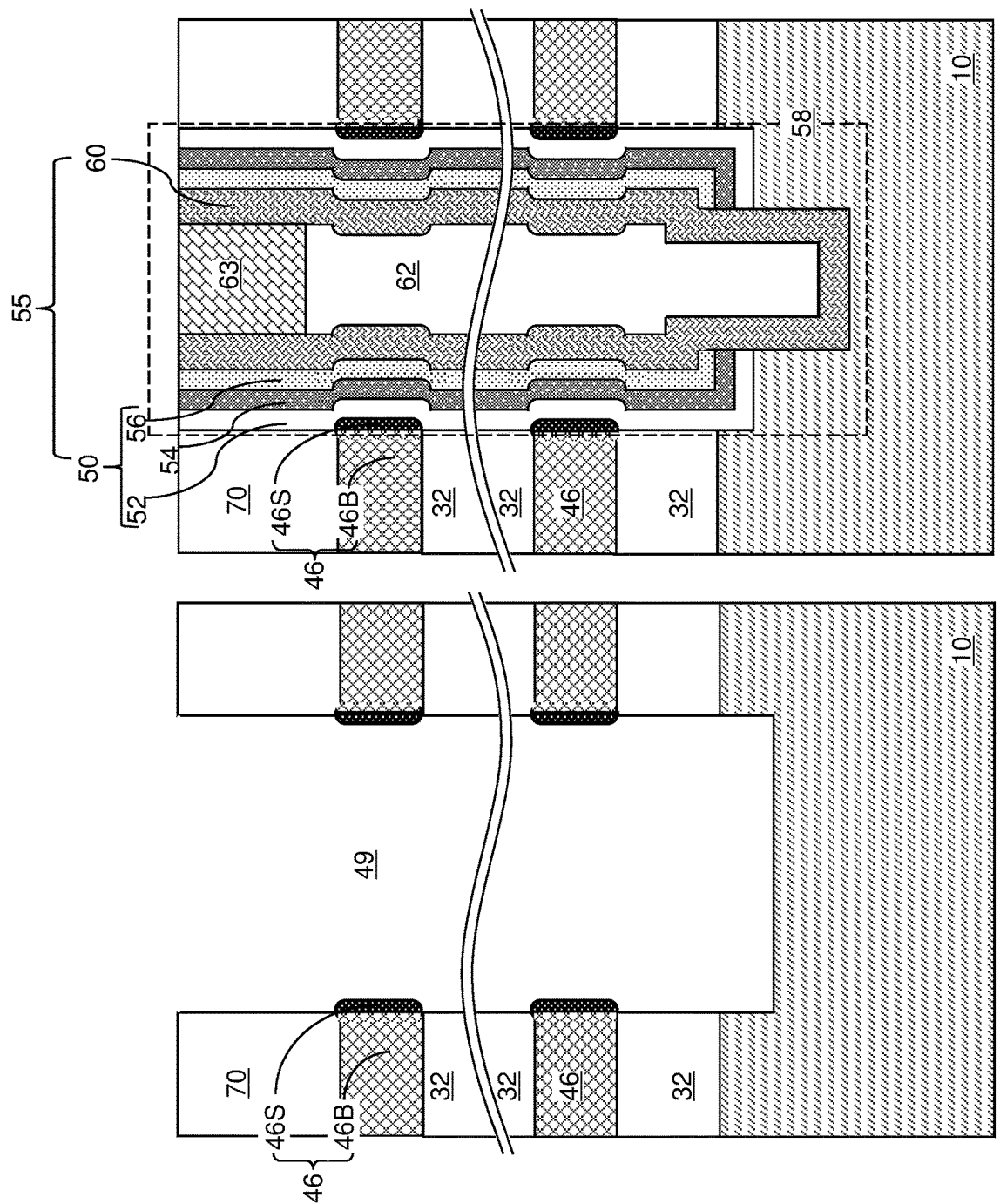

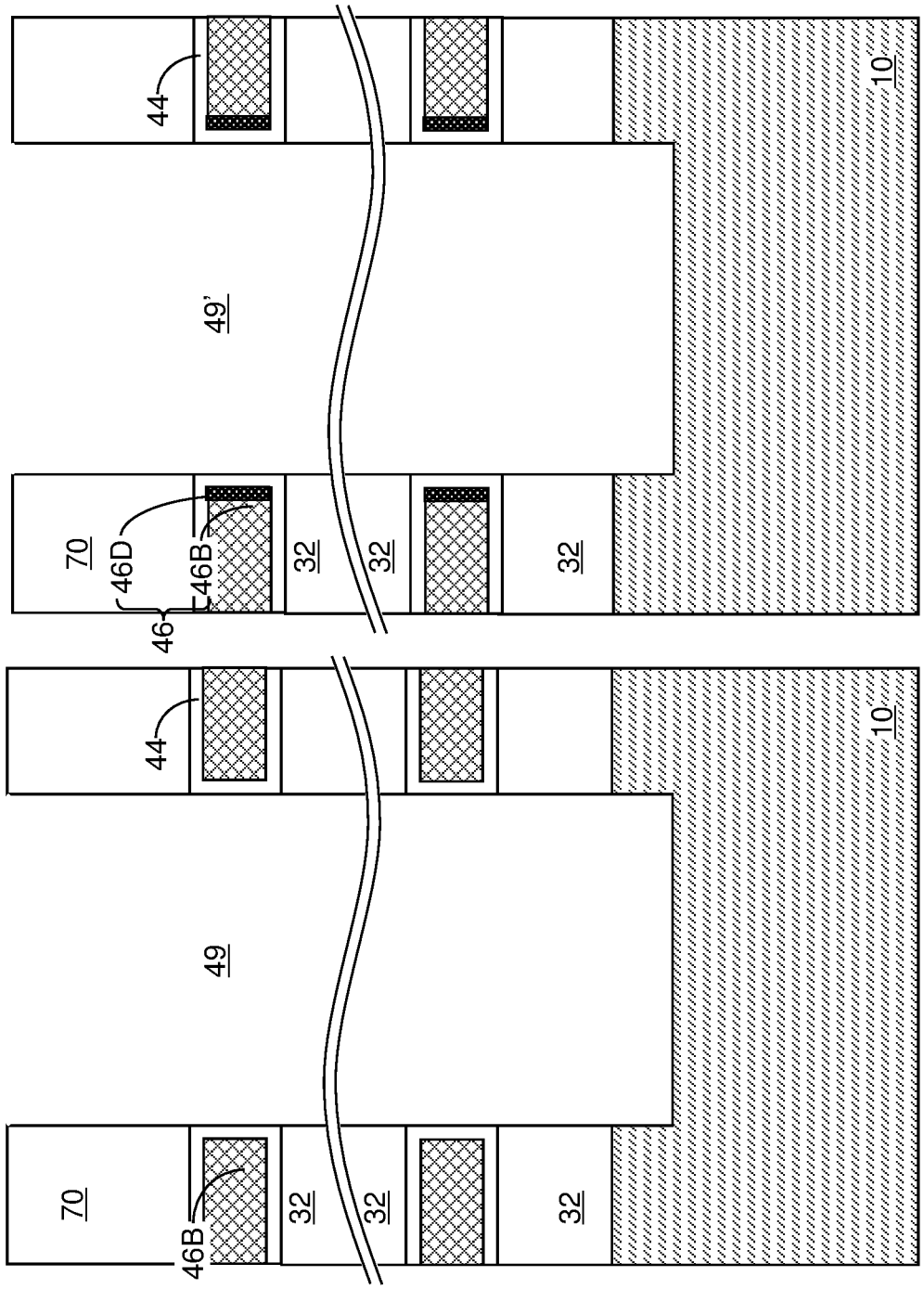

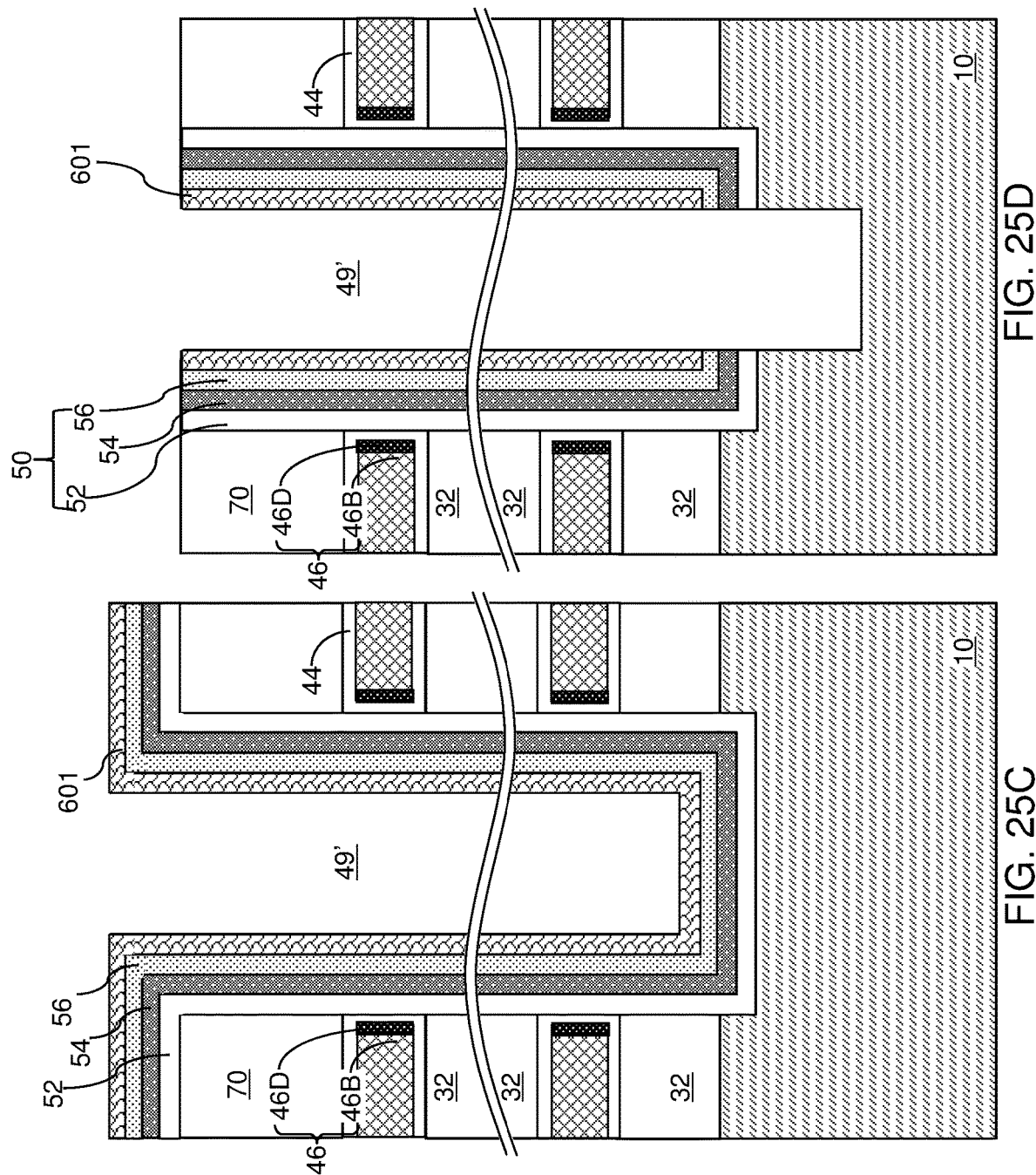

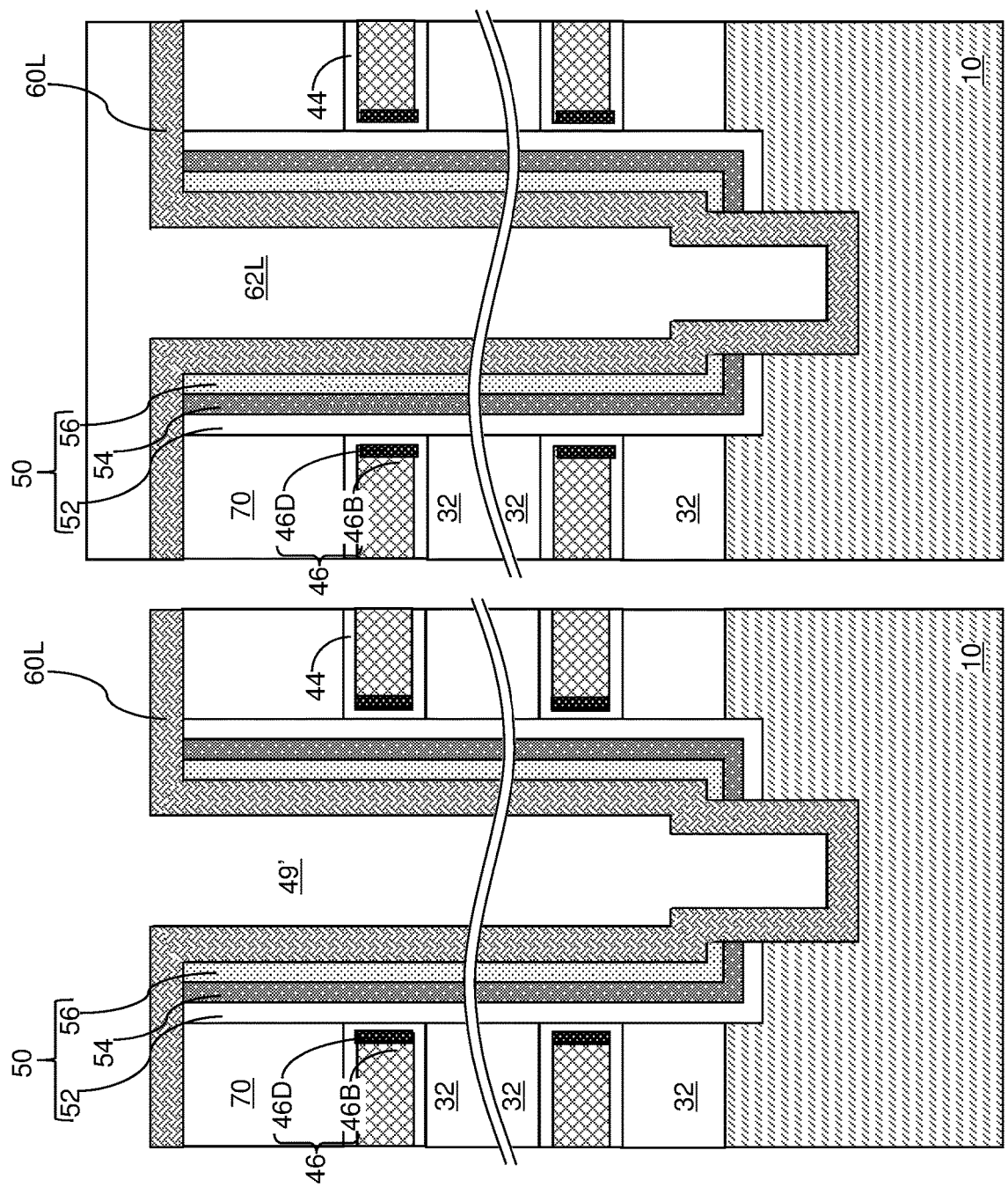

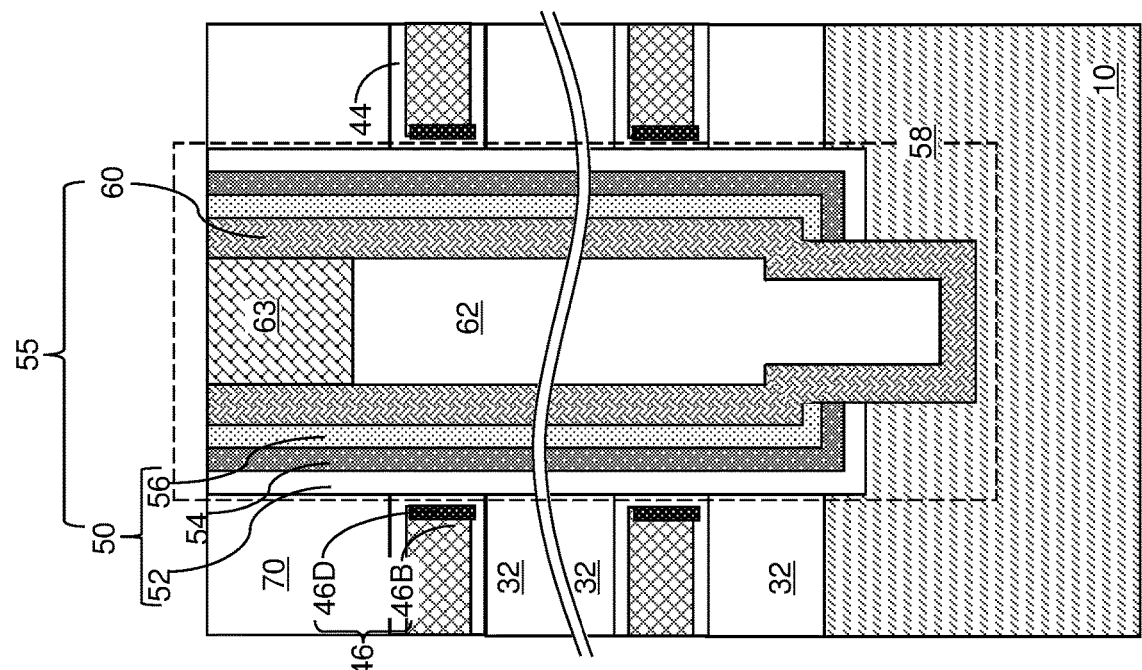
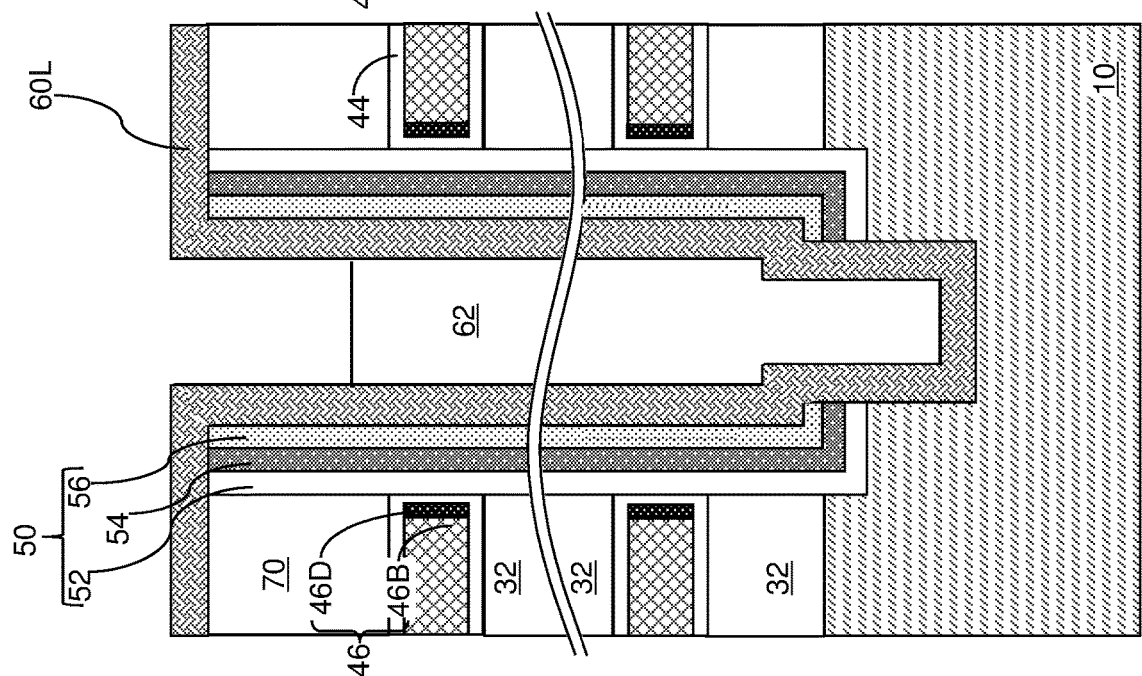

US 11,877,446 B2

1

THREE-DIMENSIONAL MEMORY DEVICE WITH ELECTRICALLY CONDUCTIVE LAYERS CONTAINING VERTICAL TUBULAR LINERS AND METHODS FOR FORMING THE SAME

FIELD

The present disclosure relates generally to the field of semiconductor devices, and particularly to a three-dimensional memory device with vertical word line barrier and methods for forming the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers; memory openings vertically extending through the alternating stack; and memory opening fill structures located within the memory openings, wherein each of the memory opening fill structures comprises a respective vertical stack of memory elements. Each of the electrically conductive layers comprise a metallic fill material layer and a vertical tubular metallic liner laterally surrounding a respective one of the memory opening fill structures and located between the metallic fill material layer and the respective one of the memory opening fill structures. In one embodiment, for each of the electrically conductive layers, an outer periphery of a top surface of the tubular metallic liner is laterally offset outward from an inner periphery of the top surface of the tubular metallic liner by a lateral distance between an inner sidewall of the tubular metallic liner and an outer sidewall of the tubular metallic liner. In another embodiment, for each of the electrically conductive layers, an outer periphery of a bottom surface of the tubular metallic liner is laterally offset outward from an inner periphery of the bottom surface of the tubular metallic liner by a lateral distance between an inner sidewall of the tubular metallic liner and an outer sidewall of the tubular metallic liner.

According to another aspect of the present disclosure, a method of forming a three-dimensional memory device comprises forming an alternating stack of insulating layers and sacrificial material layers over a substrate; forming memory openings through the alternating stack; forming sacrificial memory opening fill structures within the memory openings; forming backside recesses by removing the sacrificial material layers selective to the insulating layers and the sacrificial memory opening fill structures; forming electrically conductive layers in the respective backside recesses; forming cavities within volumes of the memory openings by removing the sacrificial memory opening fill structures after forming the electrically conductive layers; forming vertical stacks of tubular metallic liners on or in the electrically conductive layers through the memory openings; and forming memory opening fill structures in the cavities within the volumes of the memory openings, wherein each of the memory opening fill structures comprises a respective vertical stack of memory elements.

According to yet another aspect of the present disclosure, a three-dimensional memory device is provided, which comprises: an alternating stack of insulating layers and electrically conductive layers located over a substrate; memory openings vertically extending through the alternating stack; memory opening fill structures located within the memory openings, wherein each of the memory opening fill structures comprises a respective vertical stack of memory elements; and backside blocking dielectric layers which surround the respective electrically conductive layers on at least three sides. Each of the electrically conductive layers comprises a metallic fill material layer and a vertical tubular metallic liner laterally surrounding a respective one of the memory opening fill structures, and located between the metallic fill material layer and a vertically-extending portion of the respective one of the backside blocking dielectric layers.

According to still another aspect of the present disclosure, a method of forming a three-dimensional memory device comprises forming an alternating stack of insulating layers and sacrificial material layers over a substrate; forming memory openings through the alternating stack; forming sacrificial memory opening fill structures within the memory openings; forming backside recesses by removing the sacrificial material layers selective to the insulating layers and the sacrificial memory opening fill structures; forming electrically conductive layers in the backside recesses, wherein each of the electrically conductive layers comprises a metallic fill material layer; forming cavities within volumes of the memory openings by removing the sacrificial memory opening fill structures selective to the insulating layers and the electrically conductive layers; forming vertical stacks of tubular metallic liners in the electrically conductive layers by conversion of vertical portions of metallic fill material layers exposed in the cavities into a metallic compound material by nitridation, oxidation, or incorporation of boron atoms; and forming memory opening fill structures in the cavities within the volumes of the memory openings, wherein each of the memory opening fill structures comprises a respective vertical stack of memory elements.

BRIEF DESCRIPTION OF THE DRAWINGS

FIG. 3 is a schematic vertical cross-sectional view of the first exemplary structure after formation of stepped terraces and a retro-stepped dielectric material portion according to the first embodiment of the present disclosure.

FIGS. 13A-13H are sequential schematic vertical cross-sectional views of a memory opening within the first exemplary structure during formation of a memory stack structure, an optional dielectric core, and a drain region therein according to the first embodiment of the present disclosure.

FIGS. 14A and 14B illustrate sequential vertical cross-sectional views of a memory opening within a first alternative configuration of the first exemplary structure according to the first embodiment of the present disclosure.

FIGS. 15A and 15B illustrate sequential vertical cross-sectional views of a memory opening within a second alternative configuration of the first exemplary structure according to the first embodiment of the present disclosure.

FIGS. 16A and 16B illustrate sequential vertical cross-sectional views of a memory opening within a third alternative configuration of the first exemplary structure according to the first embodiment of the present disclosure.

FIGS. 19A and 19B are sequential schematic vertical cross-sectional views of a memory opening within a fifth alternative configuration of the first exemplary structure during formation of a memory stack structure, an optional dielectric core, and a drain region therein according to the first embodiment of the present disclosure.

FIGS. 25A-25H are sequential schematic vertical cross-sectional views of a memory opening within the second exemplary structure during formation of a memory stack structure, an optional dielectric core, and a drain region therein according to the second embodiment of the present disclosure.

DETAILED DESCRIPTION

Figure 1:
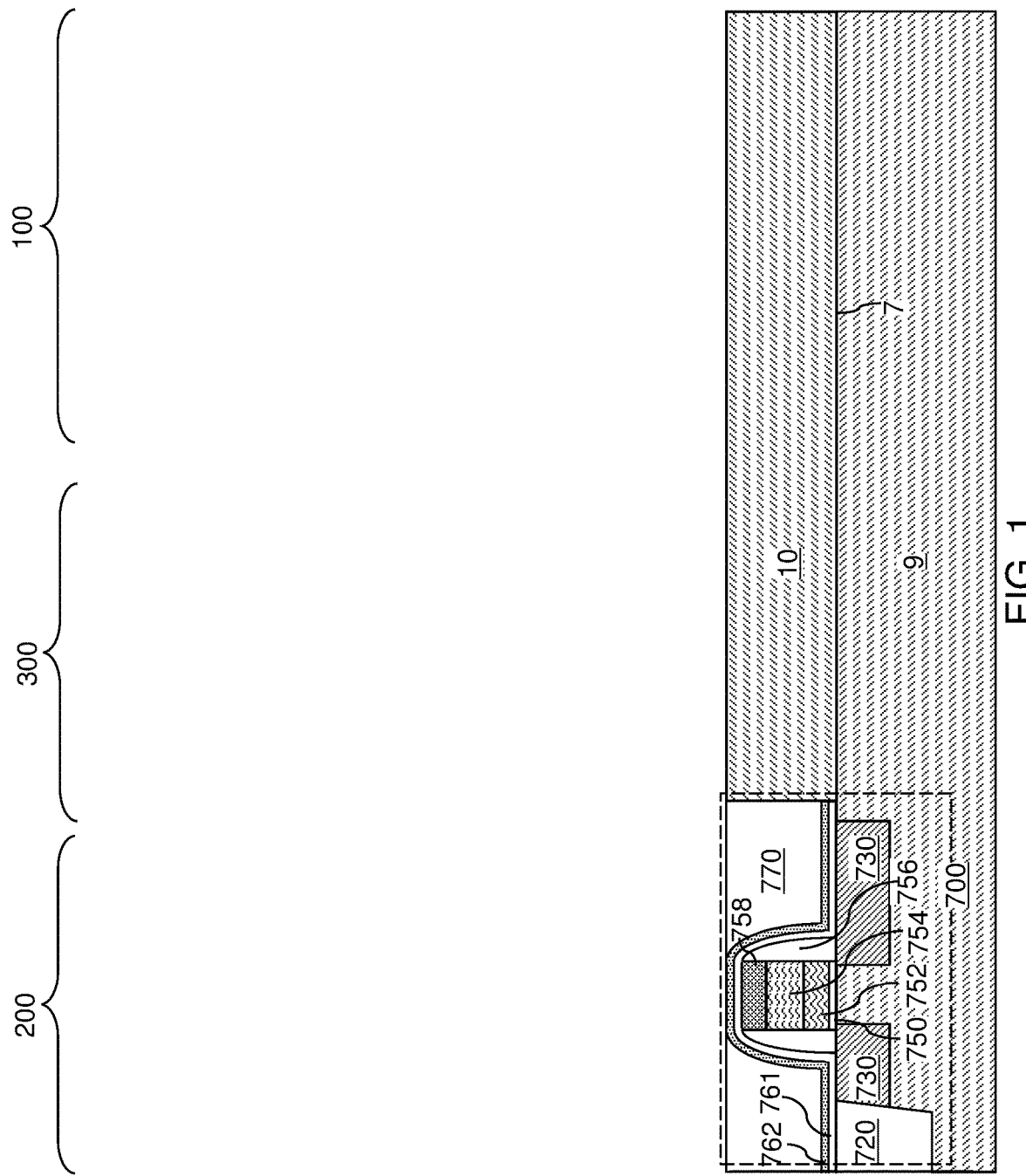
FIG. 1 is a schematic vertical cross-sectional view of a first exemplary structure after formation of at least one peripheral device, a semiconductor material layer, and a gate dielectric layer according to a first embodiment of the present disclosure.

As discussed above, the present disclosure is directed to a three-dimensional memory device containing a vertical word line barrier and methods for forming the same, the various aspects of which are described below. The embodiments of the disclosure can be employed to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, a first exemplary structure according to an embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "electrically conductive material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
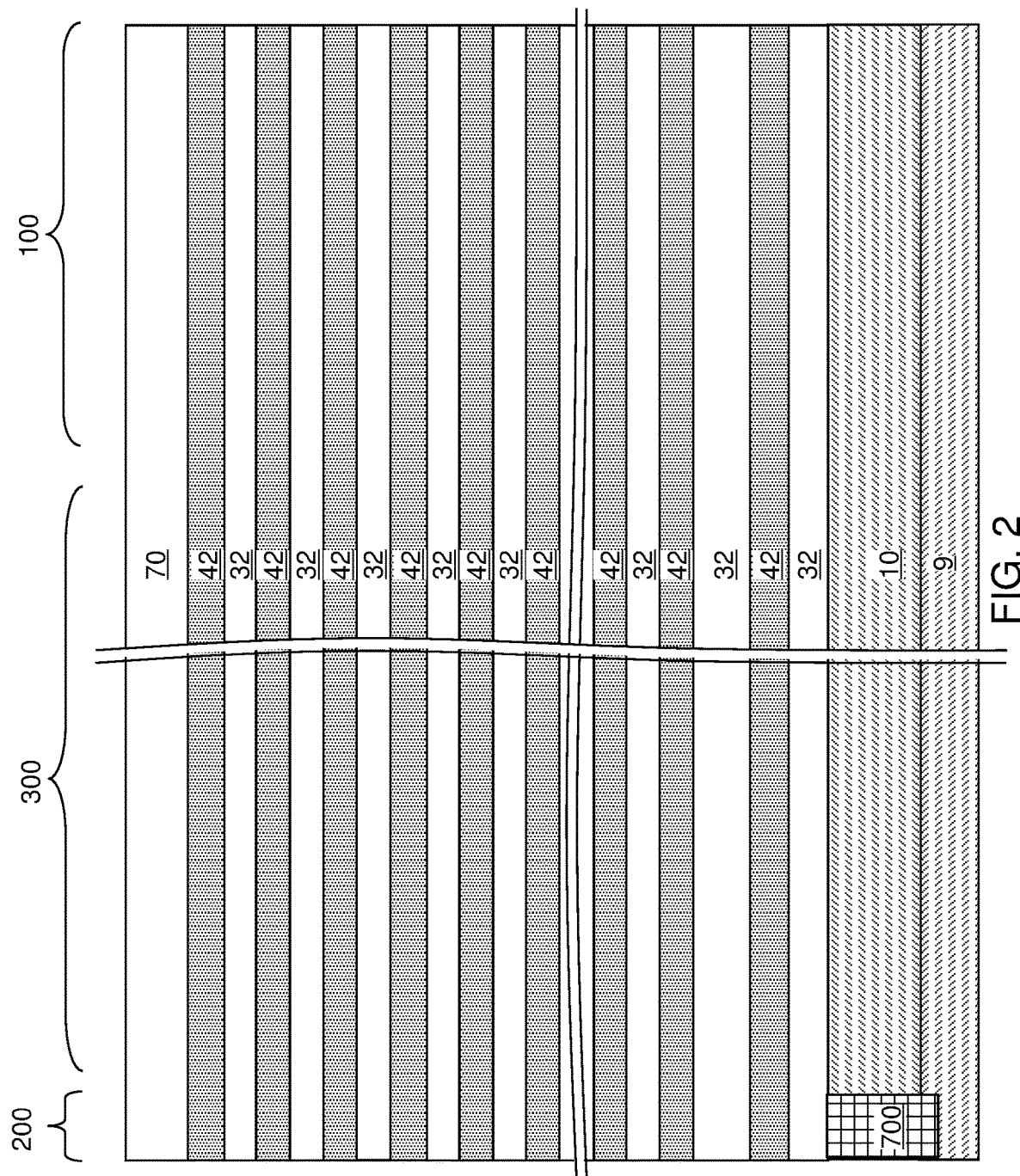
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the insulating cap layer 70 and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 4A:
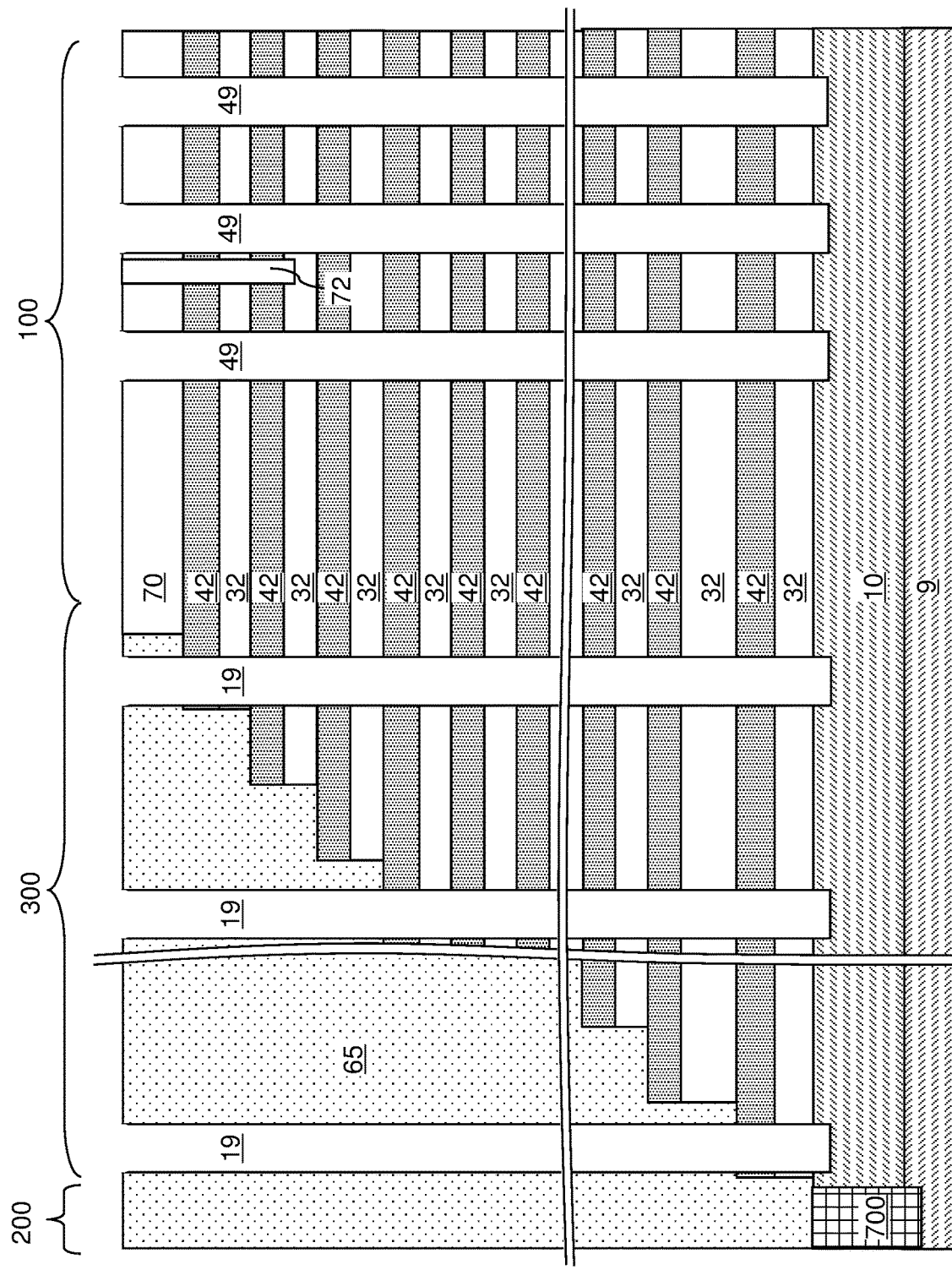
FIG. 4A is a schematic vertical cross-sectional view of the first exemplary structure after formation of memory openings and support openings according to the first embodiment of the present disclosure.
Figure 4B:
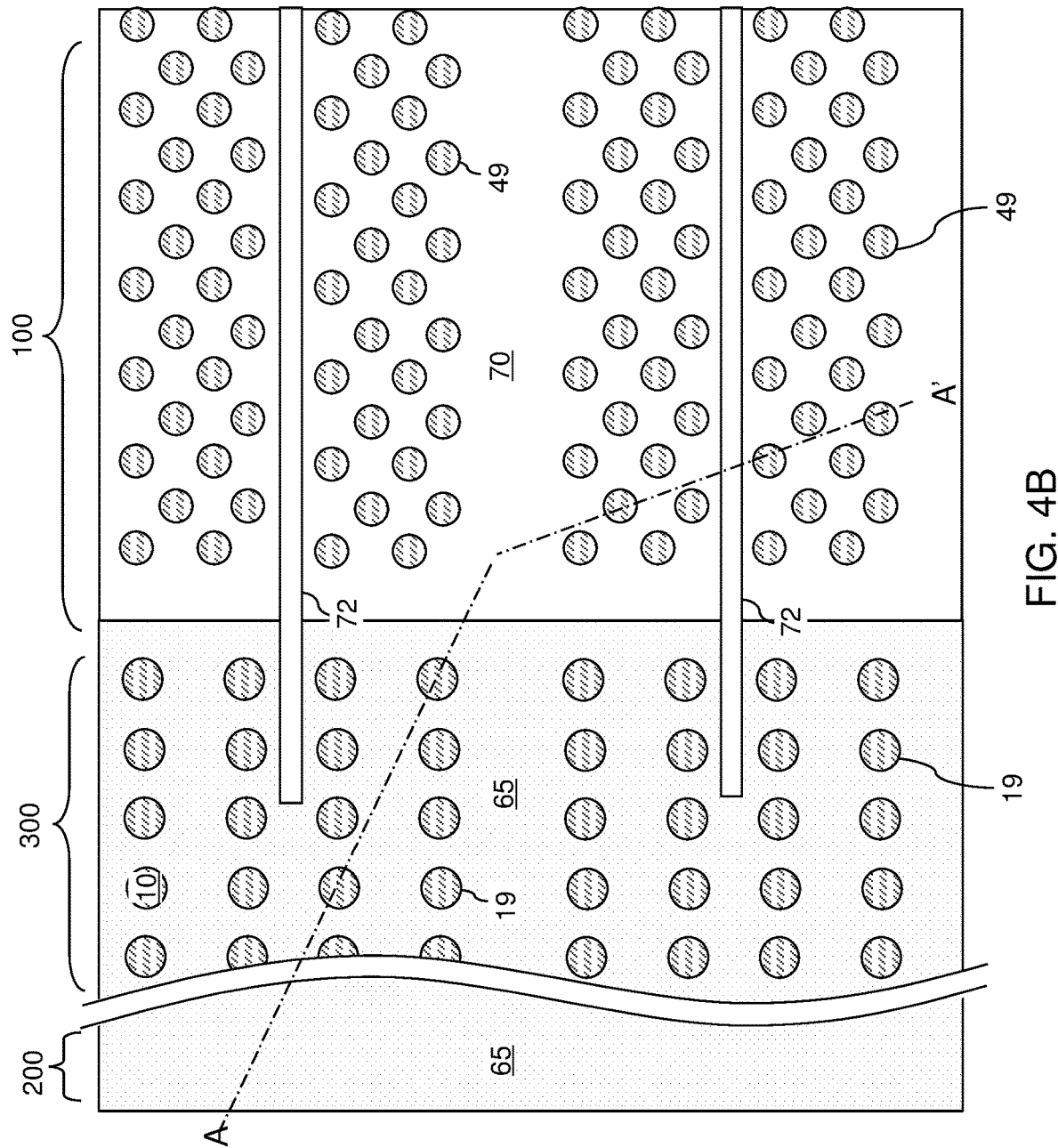
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

Figure 5A:
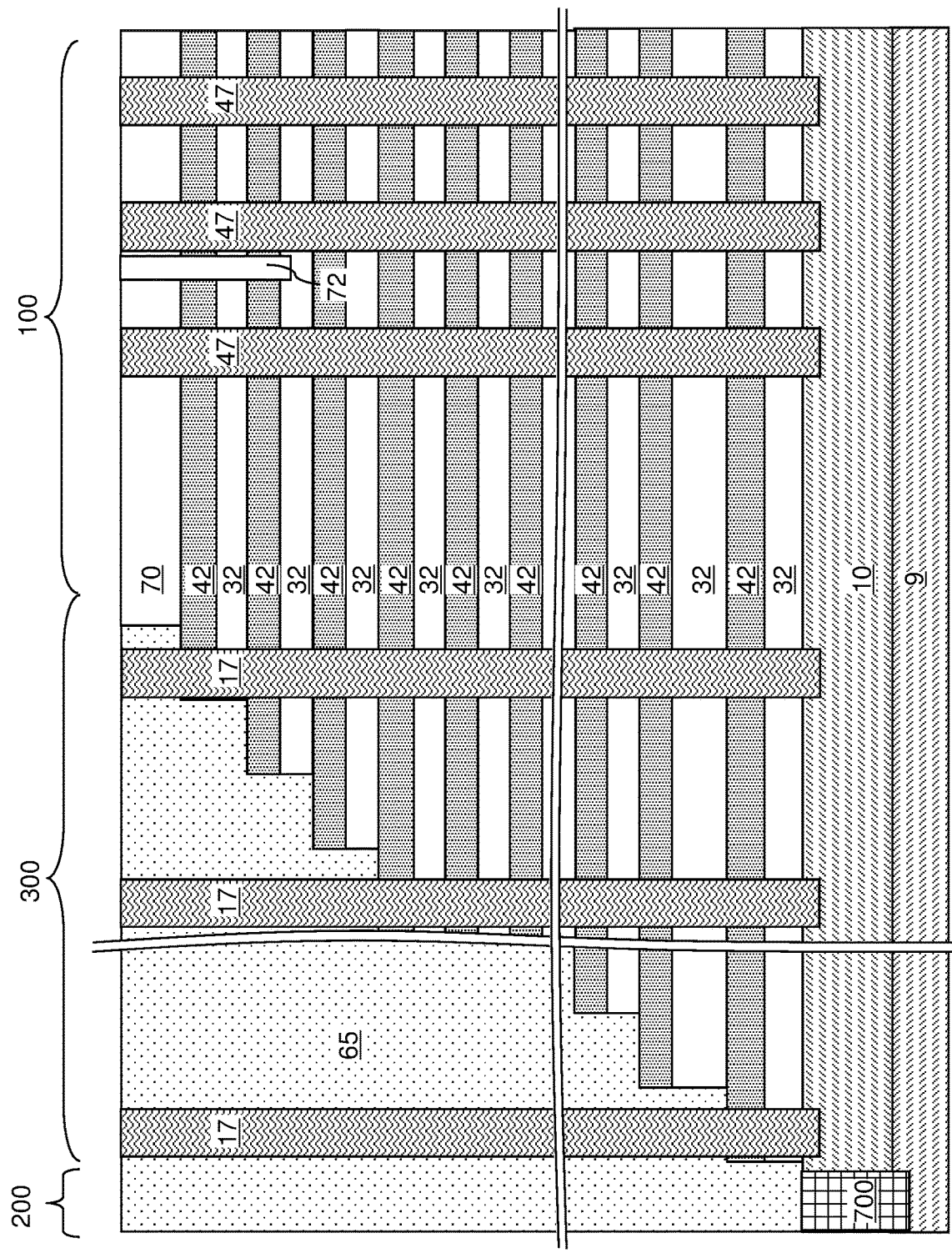
FIG. 5A is a schematic vertical cross-sectional view of the first exemplary structure after formation of sacrificial memory opening fill structures and sacrificial support opening fill structures according to the first embodiment of the present disclosure.
Figure 5B:
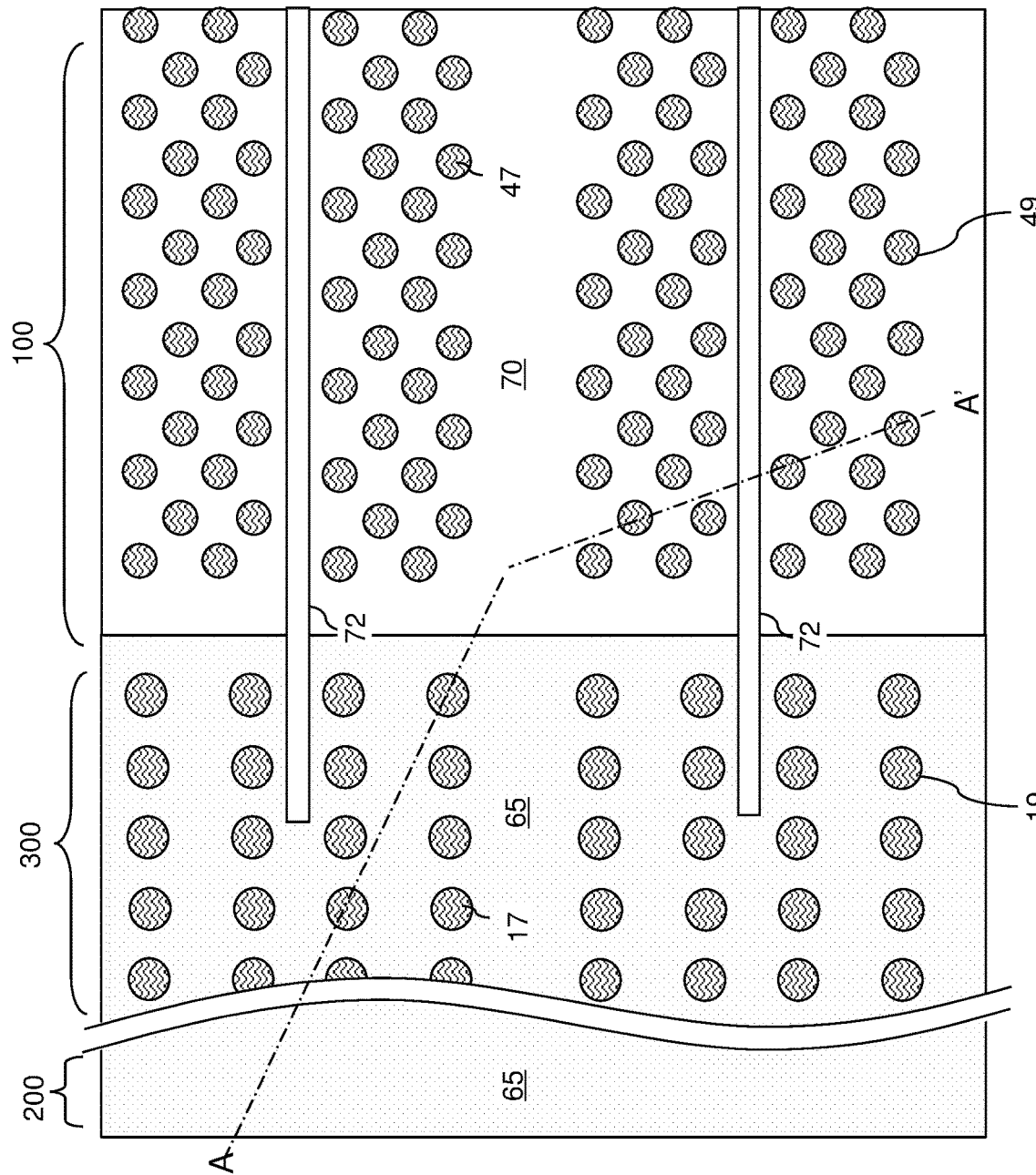
FIG. 5B is a top-down view of the first exemplary structure of FIG. 5A. The vertical plane A-A' is the plane of the cross-section for FIG. 5A.

Referring to FIGS. 5A and 5B, a sacrificial fill material can be deposited in the memory openings 49 and in the support openings 19. The sacrificial fill material includes a material that may be removed selective to materials of the insulating layers 32 and sacrificial material layers 42. Optionally, a sacrificial liner layer (not illustrated) may be formed on sidewalls of the memory openings 49 and the support openings 19 to facilitate removal of the sacrificial fill material selective to the materials of the insulating layers 32 and the sacrificial material layers 42. In one embodiment, the sacrificial fill material may include a semiconductor material, such as amorphous silicon, polysilicon, or a silicon-germanium alloy, or may include a carbon-based material such as amorphous carbon or diamond-like carbon, or may include a dielectric material, such as organosilicate glass or borosilicate glass, or a polymer material. Excess portions of the sacrificial fill material can be removed from above the horizontal plane including the top surface of the insulating cap layer 70. Each remaining portion of the sacrificial fill material filling the memory openings 49 constitutes a sacrificial memory opening fill structure 47, and each remaining portion of the sacrificial fill material filling the support openings 19 constitutes a sacrificial support opening fill structure 17.

Figure 6A:
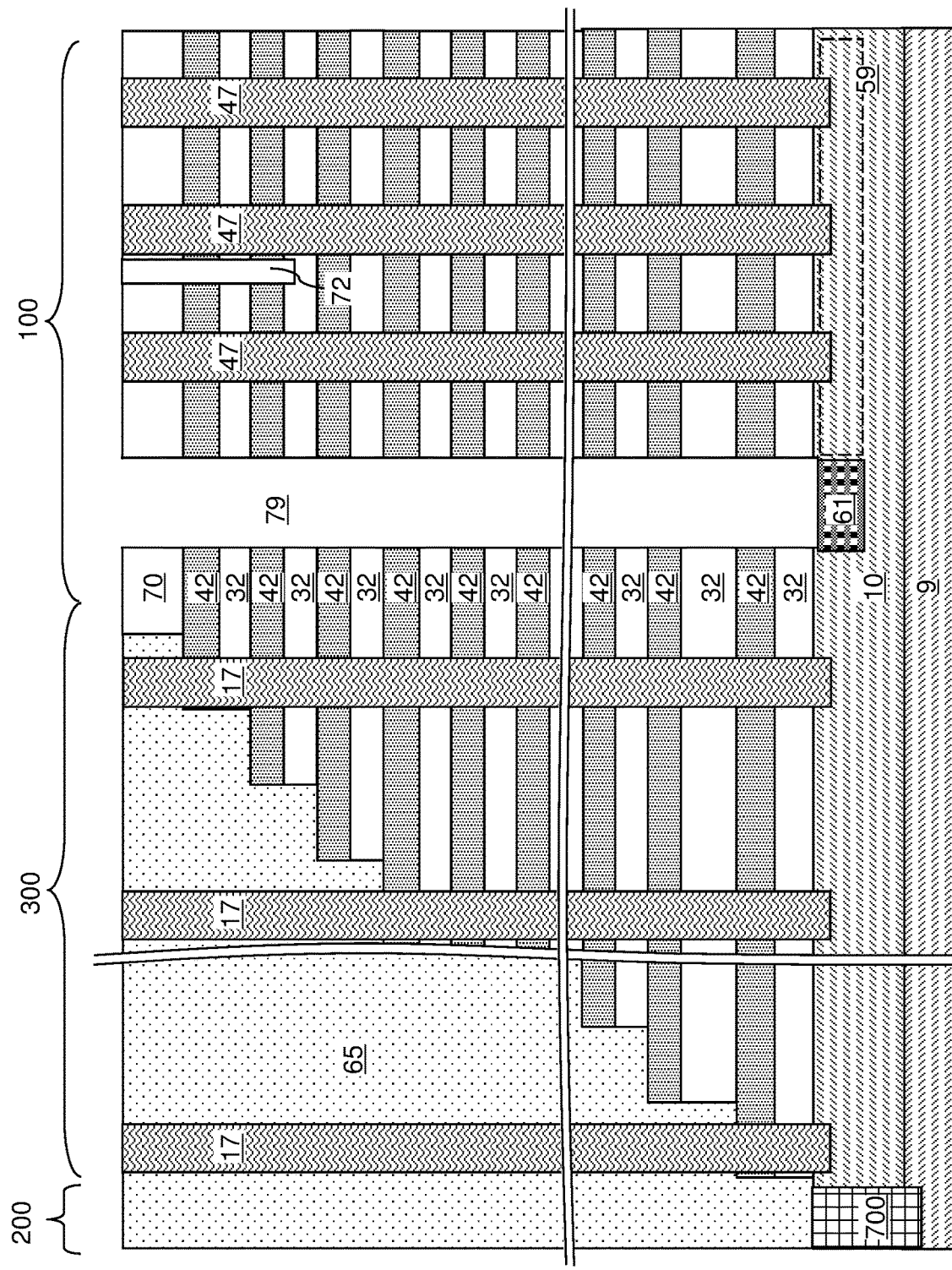
FIG. 6A is a schematic vertical cross-sectional view of the first exemplary structure after formation of backside trenches according to the first embodiment of the present disclosure.
Figure 6B:
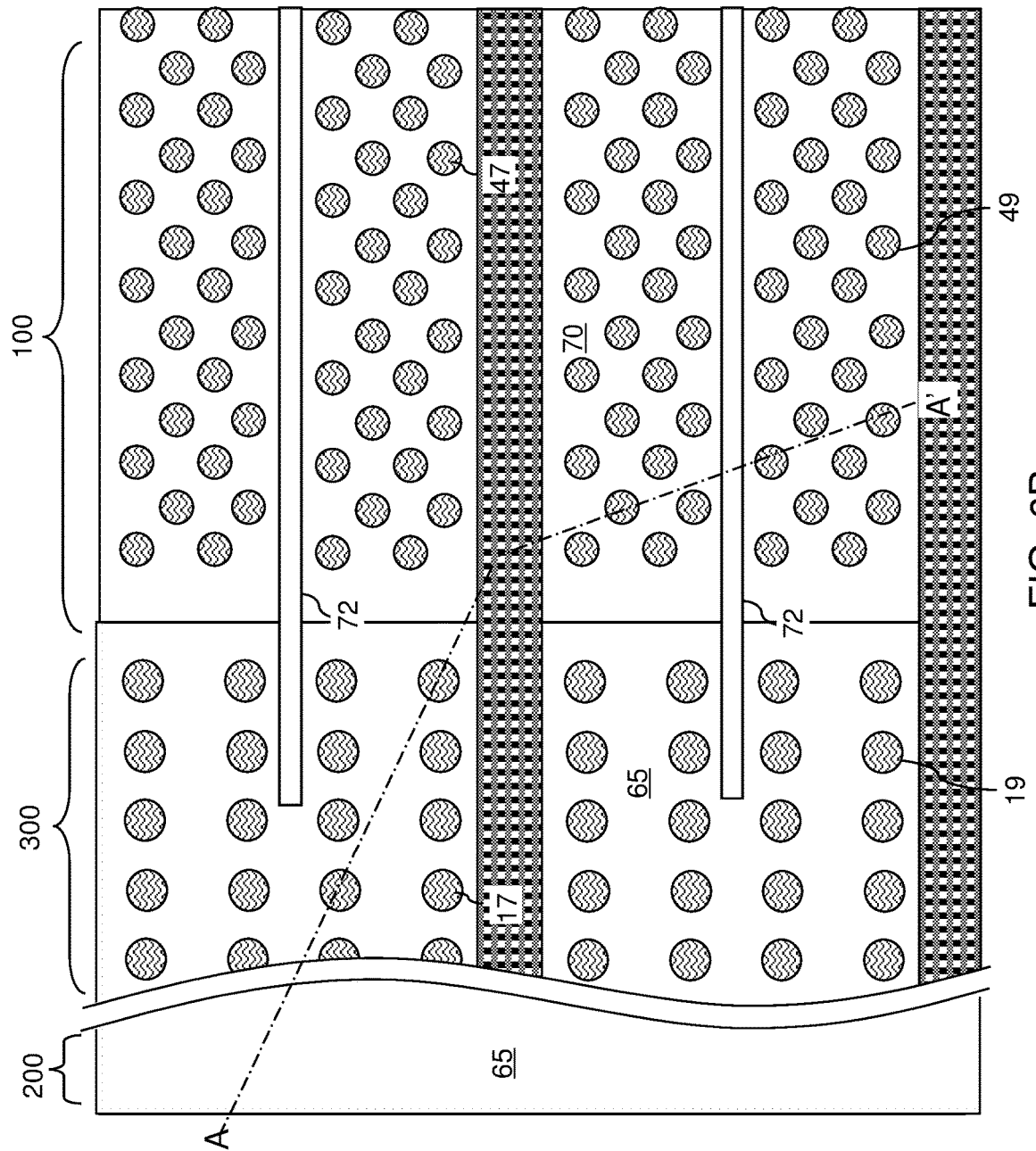
FIG. 6B is a partial see-through top-down view of the first exemplary structure of FIG. 6A. The vertical plane A-A' is the plane of the schematic vertical cross-sectional view of FIG. 6A.

Referring to FIGS. 6A and 6B, a photoresist layer (not shown) can be applied over the insulating cap layer 70, and is lithographically patterned to form openings in areas between clusters of sacrificial memory opening fill structure 47. The pattern in the photoresist layer can be transferred through the alternating stack (32, 42) and/or the retro-stepped dielectric material portion 65 employing an anisotropic etch to form backside trenches 79, which vertically extend from the top surface of the insulating cap layer 70 at least to the top surface of the substrate (9, 10), and laterally extend through the memory array region 100 and the contact region 300.

In one embodiment, the backside trenches 79 can laterally extend along a first horizontal direction (e.g., word line direction) hd1 and can be laterally spaced apart among one another along a second horizontal direction (e.g., bit line direction) hd2 that is perpendicular to the first horizontal direction hd1. The sacrificial memory opening fill structures 47 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of sacrificial memory opening fill structures 47 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

A source region 61 can be formed at a surface portion of the semiconductor material layer 10 under each backside trench 79 by implantation of electrical dopants into physically exposed surface portions of the semiconductor material layer 10. Each source region 61 is formed in a surface portion of the substrate (9, 10) that underlies a respective backside trench 79. An upper portion of the semiconductor material layer 10 that extends between the source region 61 and the plurality of sacrificial memory opening fill structures 47 constitutes a horizontal semiconductor channel 59.

Figure 7:
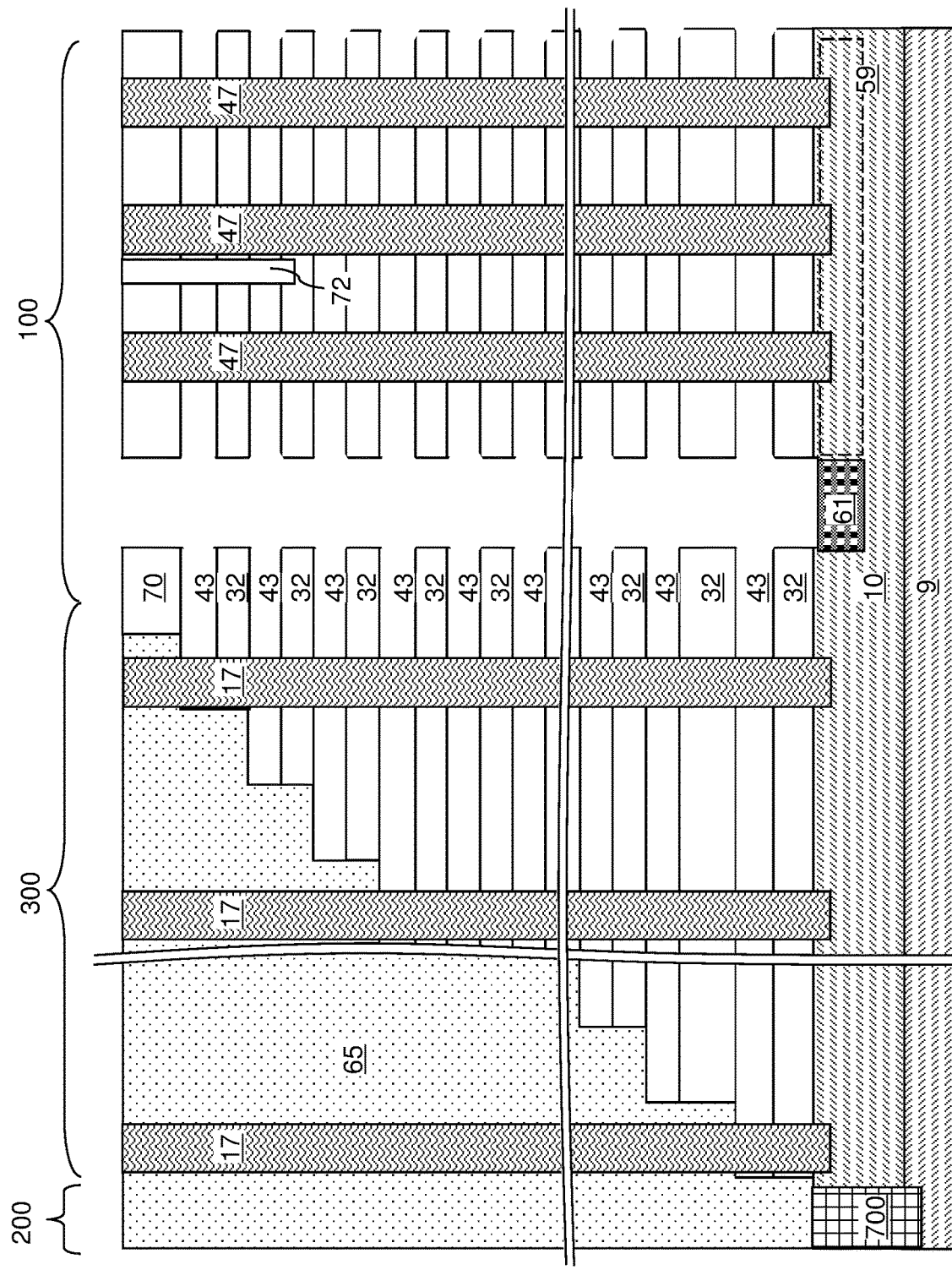
FIG. 7 is a schematic vertical cross-sectional view of the first exemplary structure after formation of backside recesses according to the first embodiment of the present disclosure.

Referring to FIG. 7, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the sacrificial memory opening fill structures 47 and the sacrificial support opening fill structures 17. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the sacrificial memory opening fill structures 47 and the sacrificial support opening fill structures 17 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Figure 8:
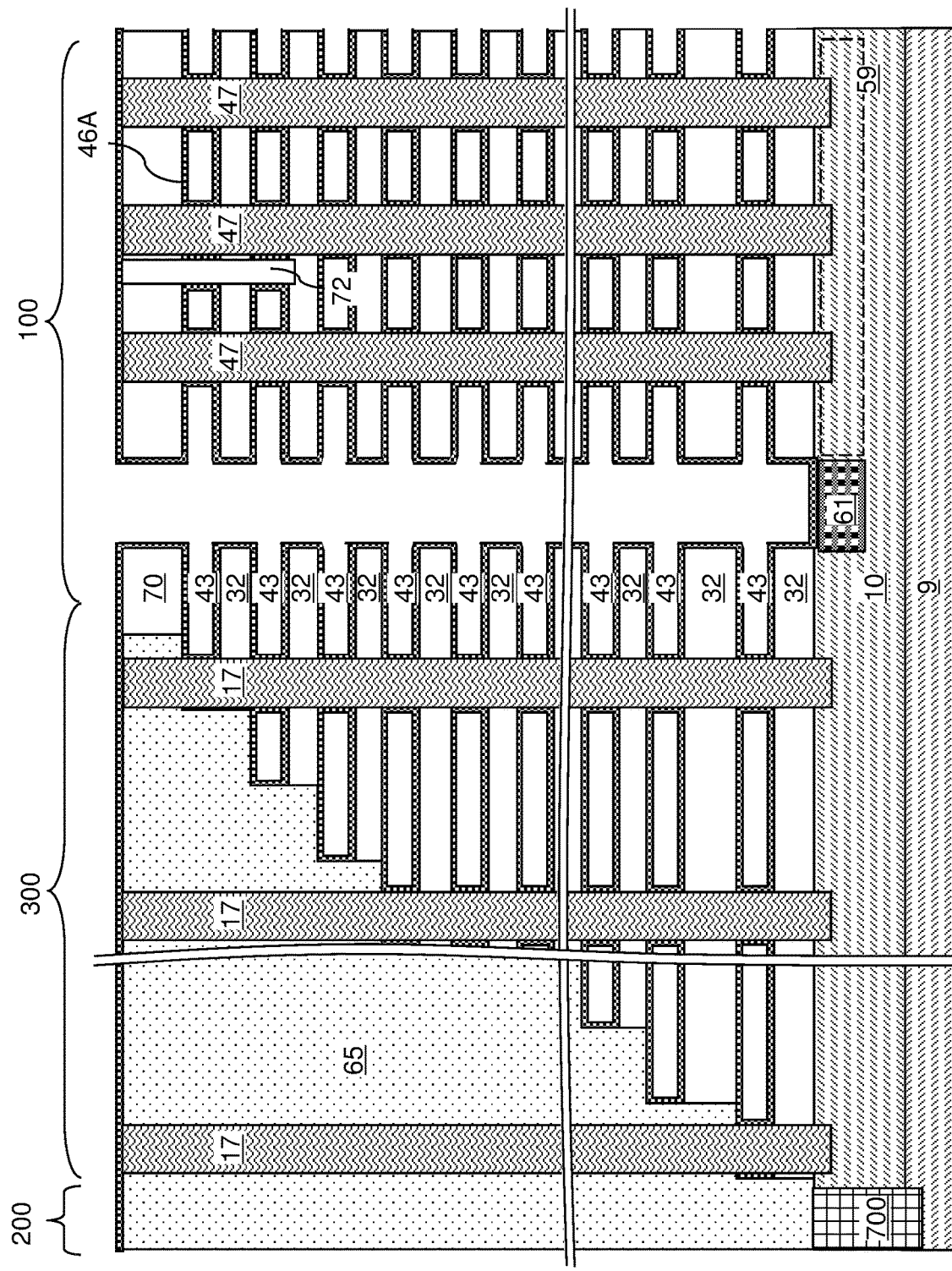
FIG. 8 is a schematic vertical cross-sectional view of the first exemplary structure after formation of a conformal metallic liner comprising a first electrically conductive material according to the first embodiment of the present disclosure.

Referring to FIG. 8, a conformal metallic liner 46A can be deposited in the backside recesses 43. The conformal metallic liner 46A includes an electrically conductive electrically conductive material that can function as a diffusion barrier layer and/or adhesion promotion layer for a metallic fill material to be subsequently deposited. The conformal metallic liner 46A can include a conductive metallic nitride material, such as TiN, WN, or TaN. In one embodiment, the conformal metallic liner 46A can be deposited by a conformal deposition process such as chemical vapor deposition (CVD) or atomic layer deposition (ALD). The thickness of the conformal metallic liner 46A can be in a range from 2 nm to 8 nm, such as from 3 nm to 6 nm, although lesser and greater thicknesses can also be employed. In one embodiment, the conformal metallic liner 46A can consist essentially of a conductive metal, nitride such as TiN.

Figure 9:
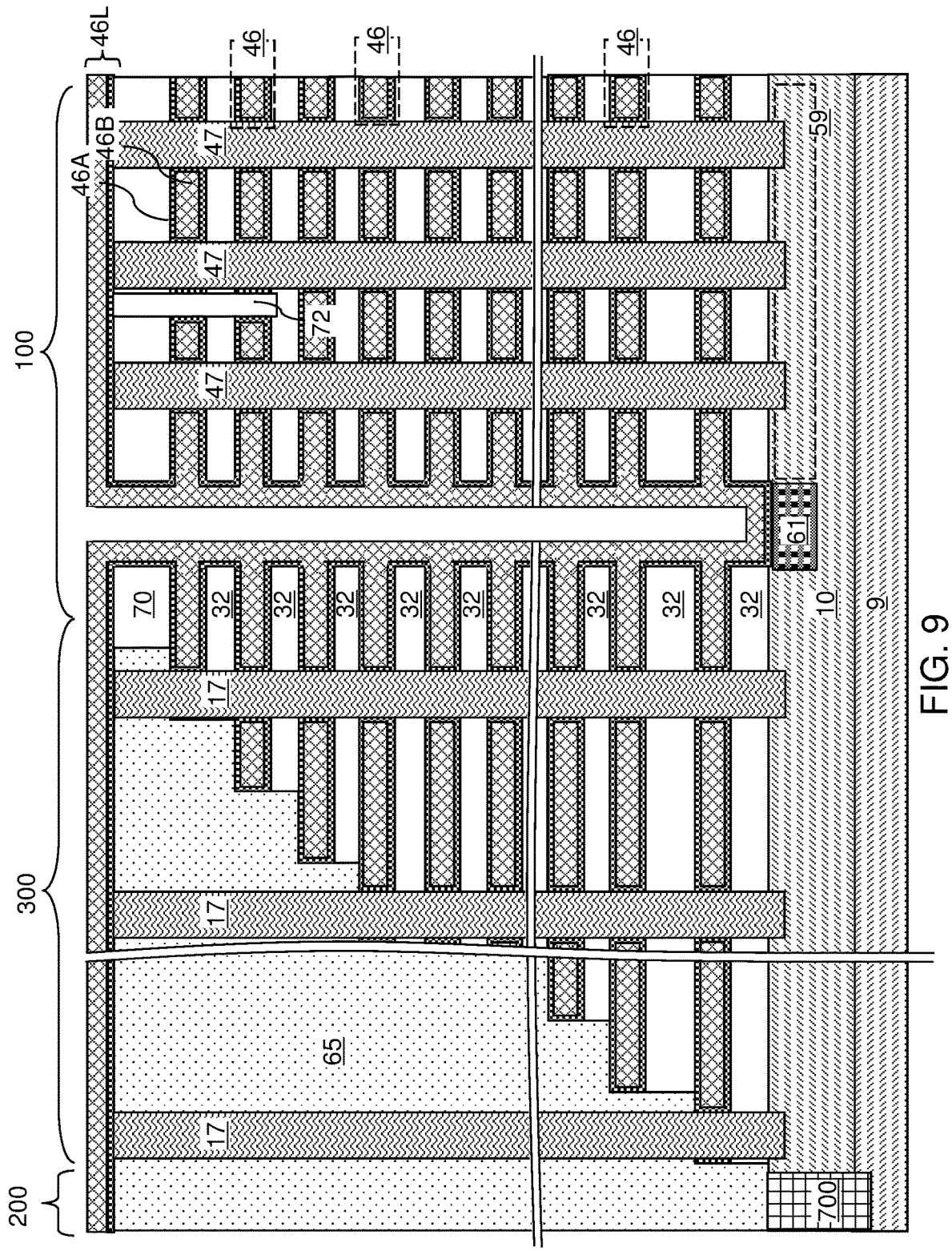
FIG. 9 is a schematic vertical cross-sectional view of the first exemplary structure after formation of a metallic fill material layer comprising a second electrically conductive material according to the first embodiment of the present disclosure.

Referring to FIG. 9, a metal fill material is deposited in the plurality of backside recesses 43, over the sidewalls of the at least one the backside trench 79, and over the top surface of the insulating cap layer 70 and directly on physically exposed surfaces of the conformal metallic liner 46A to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, molybdenum, cobalt, ruthenium, titanium, or tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the conformal metallic liner 46A, which is a conformal metallic liner that blocks diffusion of fluorine atoms therethrough.

A plurality of electrically conductive layers 46 can be formed in the plurality of backside recesses 43, and a continuous electrically conductive material layer 46L can be formed on the sidewalls of each backside trench 79 and over the insulating cap layer 70. Each electrically conductive layer 46 includes a portion of the conformal metallic liner 46A and a portion of the metallic fill material layer 46B that are located between a vertically neighboring pair of dielectric material layers such as a pair of insulating layers 32. The continuous electrically conductive material layer 46L includes a continuous portion of the conformal metallic liner 46A and a continuous portion of the metallic fill material layer 46B that are located in the backside trenches 79 or above the insulating cap layer 70. Each sacrificial material layer 42 can be replaced with an electrically conductive layer 46. A backside cavity is present in the portion of each backside trench 79 that is not filled with the continuous electrically conductive material layer 46L.

Figure 10:
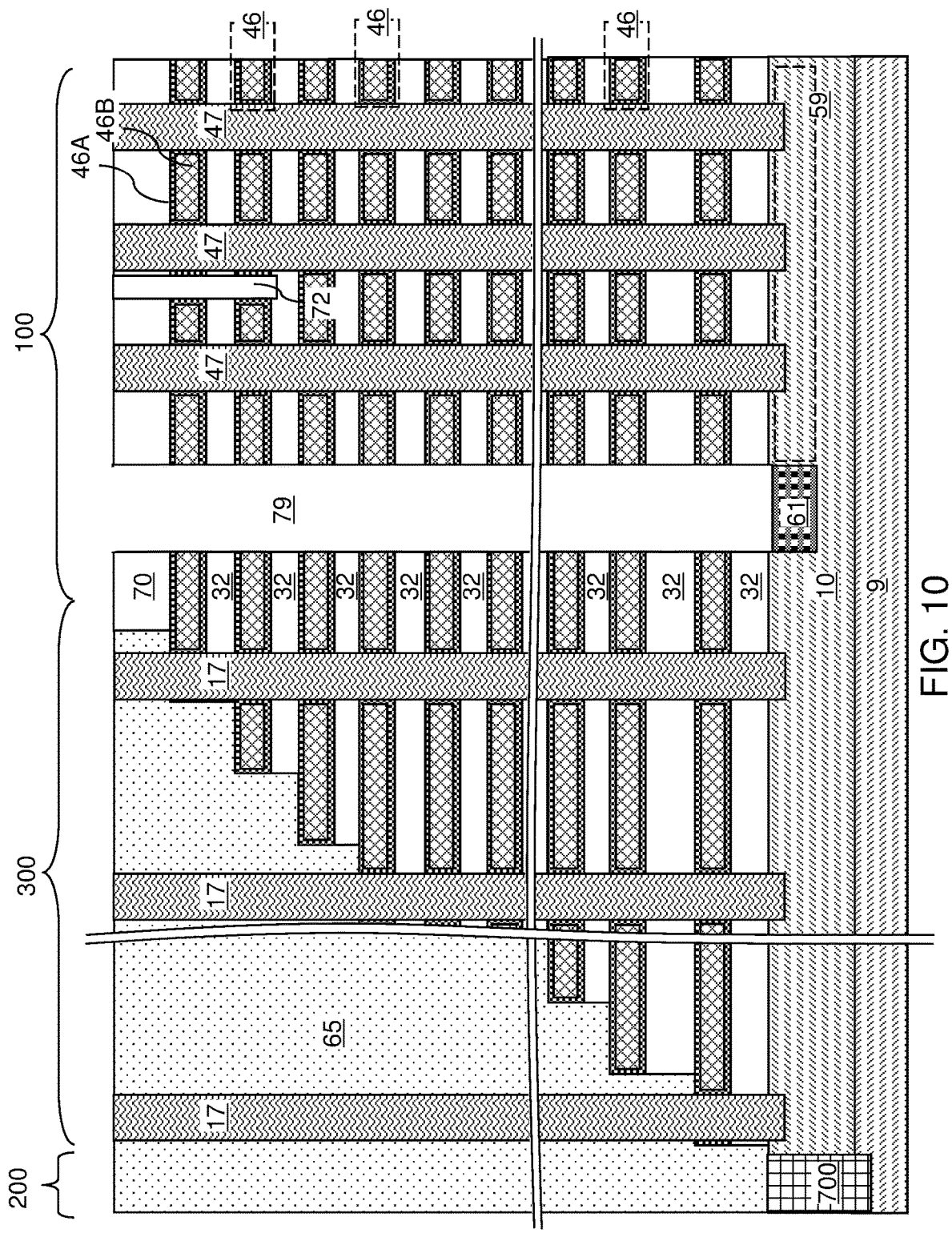
FIG. 10 is a schematic vertical cross-sectional view of the first exemplary structure after removal of electrically conductive materials from inside the backside trenches according to the first embodiment of the present disclosure.

Referring to FIG. 10, the deposited electrically conductive material of the continuous electrically conductive material layer 46L is etched back from the sidewalls of each backside trench 79 and from above the insulating cap layer 70, for example, by an isotropic wet etch, an anisotropic dry etch, or a combination thereof. Each remaining portion of the deposited electrically conductive material in the backside recesses 43 constitutes an electrically conductive layer 46. Each electrically conductive layer 46 can be a conductive line structure. Thus, the sacrificial material layers 42 are replaced with the electrically conductive layers 46. Generally, electrically conductive layers 46 can be formed in the backside recesses 43 such that each of the electrically conductive layers 46 comprises a conformal metallic liner 46A comprising a first electrically conductive material and a metallic fill material layer 46B that is formed on the conformal metallic liner 46A.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. At least one uppermost and lowermost electrically conductive layer 46 can function as a drain side and source side select gate electrode, respectively.

Figure 11:
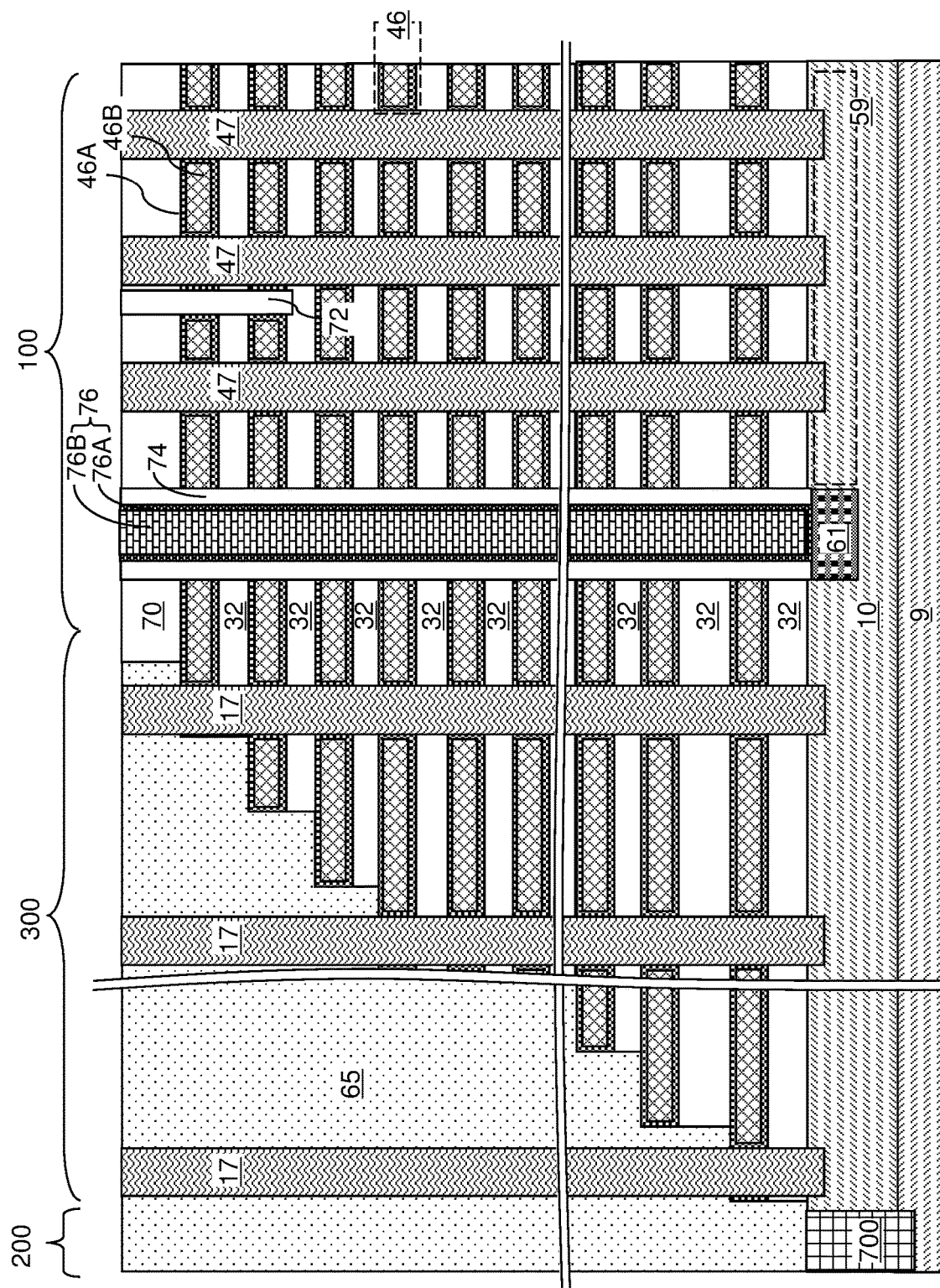
FIG. 11 is a schematic vertical cross-sectional view of the first exemplary structure after formation of an insulating spacer and a backside contact structure according to the first embodiment of the present disclosure.

Referring to FIG. 11, an insulating material layer can be formed in the backside trenches 79 and over the insulating cap layer 70 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the insulating cap layer 70 and at the bottom of each backside trench 79. Each remaining portion of the insulating material layer constitutes an insulating spacer 74. A backside cavity is present within a volume surrounded by each insulating spacer 74. A top surface of the semiconductor material layer 10 can be physically exposed at the bottom of each backside trench 79.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the insulating cap layer 70 overlying the alternating stack (32, 46) as a stopping layer. If chemical mechanical planarization (CMP) process is employed, the insulating cap layer 70 can be employed as a CMP stopping layer. Each remaining continuous portion of the at least one conductive material in the backside trenches 79 constitutes a backside contact via structure 76. The backside contact via structure 76 extends through the alternating stack (32, 46), and contacts a top surface of a source region 61. Generally, a backside contact via structure 76 can be formed within each of the backside trenches 79 after formation of the insulating spacers 74 by depositing and planarizing at least one conductive material in volumes of the backside trenches 79 that are not filled with the insulating spacers 74.

Alternatively, the above described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact an side of the lower portion of the semiconductor channel 60.

Figure 12:
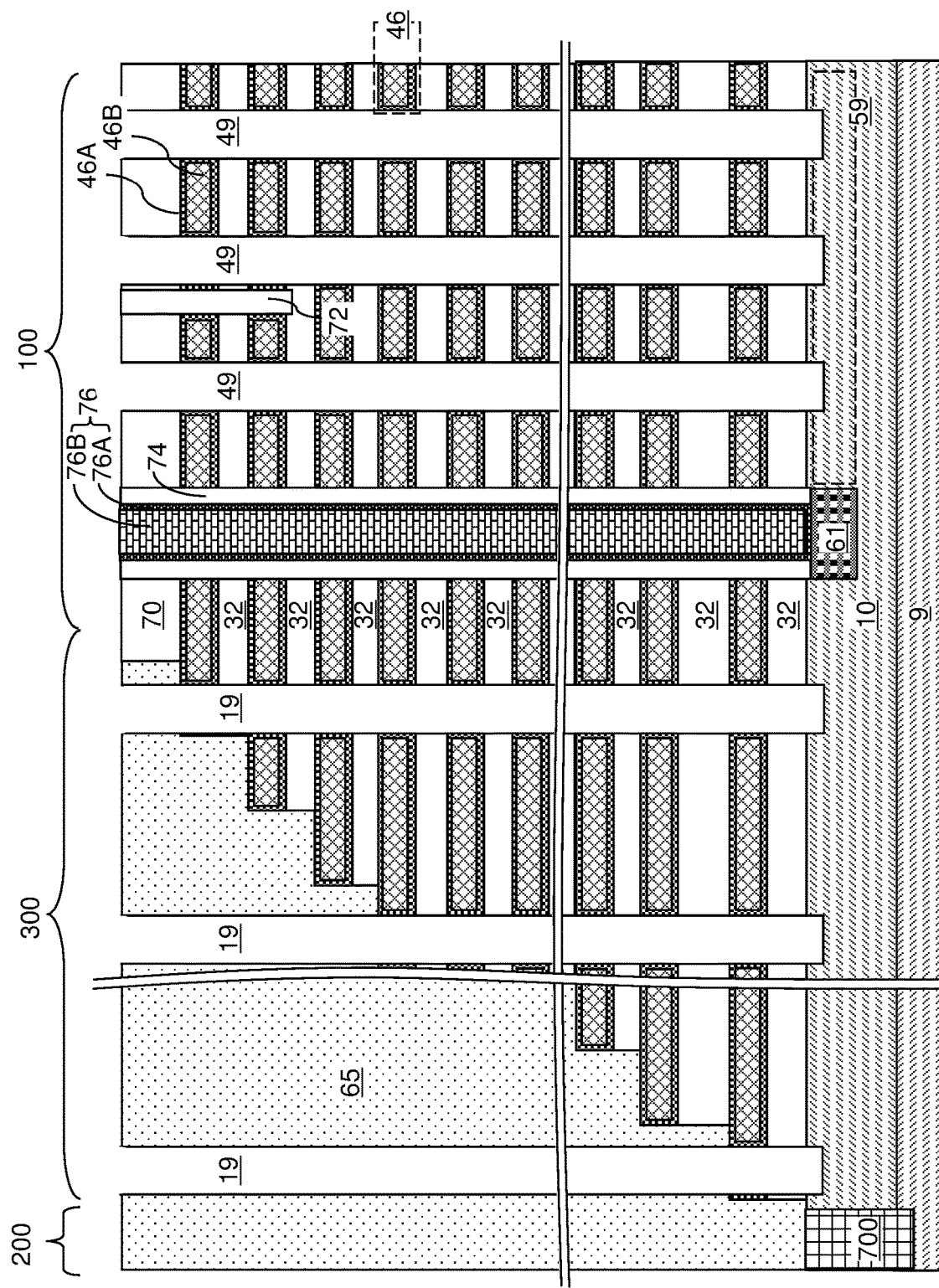
FIG. 12 is a schematic vertical cross-sectional view of the first exemplary structure after removal of the memory opening fill structures and the sacrificial support opening fill structures according to the first embodiment of the present disclosure.

Referring to FIG. 12, a selective etch process can be performed to etch the sacrificial fill material of the sacrificial memory opening fill structures 47 and the sacrificial support opening fill structures 17 selective to the materials of the insulating layers 32, the electrically conductive layers 46, and the semiconductor material layer 10. For example, if the sacrificial fill material of the sacrificial memory opening fill structures 47 and the sacrificial support opening fill structures 17 comprises amorphous silicon or polysilicon, then a wet etch process using hot trimethyl-2 hydroxyethyl ammonium hydroxide ("hot TMY") or tetramethyl ammonium hydroxide (TMAH) may be performed to remove the sacrificial memory opening fill structures 47 and the sacrificial support opening fill structures 17. If the sacrificial fill material of the sacrificial memory opening fill structures 47 and the sacrificial support opening fill structures 17 comprises amorphous carbon or diamond-like carbon, an ashing process may be employed to remove the sacrificial memory opening fill structures 47 and the sacrificial support opening fill structures 17. If the sacrificial fill material of the sacrificial memory opening fill structures 47 and the sacrificial support opening fill structures 17 comprises organosilicate glass or borosilicate glass, a wet etch process using dilute hydrofluoric acid may be employed to remove the sacrificial memory opening fill structures 47 and the sacrificial support opening fill structures 17. Cavities are formed within the volumes of the memory openings 49, which are herein referred to as memory cavities. Additional cavities are formed are formed within the volumes of the support openings 19, which are herein referred to as support cavities.

FIGS. 13A-13H are sequential schematic vertical cross-sectional views of a memory opening 49 within the first exemplary structure during formation of a memory stack structure 55, an optional dielectric core 62, and a drain region 63 therein according to the first embodiment of the present disclosure. The same structural change occurs simultaneously in each of the other memory openings 49 and in each support opening 19.

Referring to FIG. 13A, a memory opening 49 in the exemplary device structure of FIG. 12 is illustrated. The memory opening 49 extends through the insulating cap layer 70, the alternating stack (32, 46), and optionally into an upper portion of the semiconductor material layer 10. At this processing step, each support opening 19 can extend through the retro-stepped dielectric material portion 65, a subset of layers in the alternating stack (32, 46), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed.

Referring to FIG. 13B, a thermal conversion process or a plasma conversion process can be performed to convert physically exposed surface portions of the conformal metallic liners 46A and/or portions of the metallic fill material layers 46C facing the memory openings 49 into tubular metallic liners 46C. The conversion process that may be performed at this processing step includes a nitridation process, an oxidation process, or incorporation of boron atoms. The nitridation process may comprise a thermal nitridation process or a plasma nitridation process. The nitridation process may employ $NH_3$ and/or $N_3$ nitrogen gas as a nitrogen source gas. The oxidation process may comprise a thermal oxidation process or a plasma oxidation process. The oxidation process may employ $H_2O$ or $O_2$ as an oxygen source gas. The incorporation of boron atoms may be effected by a thermal or plasma gas phase doping process employing diborane or another boron containing gas. In one embodiment, more than one gas may be used, such as a combination of the nitrogen source gas with oxygen or boron source gas to form a metal oxynitride or a metal boronitride tubular metallic liners 46C.

A vertical stack of tubular metallic liners 46C can be formed by conversion of tubular portions of the conformal metallic liners 46A and/or portions of the metallic fill material layers 46B that are proximal to the memory cavity 49', which is the void within the volume of the memory opening 49. Generally, the conformal metallic liners 46A and/or metallic fill material layers 46B may comprise, and/or may consist essentially of, a first electrically conductive material, and the tubular metallic liners 46C may comprise, and/or may consist essentially of, a second electrically conductive material that is different from the first electrically conductive material. The tubular metallic liners 46C may include an electrically conductive compound material including the same metal element as the conformal metallic liners 46A and/or metallic fill material layers 46B, and at least one non-metal element such as nitrogen, oxygen, and/or boron. For example, the tubular metallic liners 46C may comprise tungsten nitride, tungsten oxide, tungsten oxynitride, tungsten boronitride, molybdenum nitride, molybdenum oxide, molybdenum oxynitride, molybdenum boronitride, titanium tungsten nitride, titanium tungsten oxide, titanium tungsten oxynitride, titanium tungsten boronitride, etc.

The tubular metallic liners 46C are vertical liners. In other words, the tubular metallic liners 46C have a substantially uniform thickness in the horizontal direction, and lack horizontal portions which extend in a horizontal direction parallel to the top of the substrate along the respective top and bottom surfaces of the insulating layers 32 from the memory openings 49 toward the backside trenches 79. In contrast, the conformal metallic liners 46A include horizontal portions which extend along (and may contact) the surfaces of the insulating layers 32 from the memory openings 49 toward the backside trenches 79.

The entirety of cylindrical portions of the conformal metallic liners 46A around the memory opening 49 may be converted into a vertical stack of tubular metallic liners 46C. Incorporation of atoms of the at least one non-metallic element into the material of the tubular metallic liners 46C may increase the lateral thickness of the tubular metallic liners 46C relative to the thickness of the cylindrical portions of the conformal metallic liners 46A. In this case, inner sidewalls of the tubular metallic liners 46C may protrude inward relative to sidewalls of the insulating layers 32 in the memory opening 49. The lateral thickness of the tubular metallic liners 46C may be in a range from 2 nm to 12 nm, such as from 3 nm to 8 nm, although lesser and greater thicknesses can also be employed. Vertical stacks of tubular metallic liners 46C are formed in the electrically conductive layers 46. As such, the vertical stacks of tubular metallic liners 46C are incorporated into the electrically conductive layers 46. The tubular metallic liners 46C can increase the work function of the electrically conductive layers 46 for better data retention and higher erase efficiency, and/or can function as a diffusion barrier material that blocks diffusion of hydrogen, fluorine, and/or chlorine from the metallic fill material layers 46B more effectively than the material of the conformal metallic liners 46A, without substantially decreasing the overall conductivity of the electrically conductive layers 46. In other words, the thickness of the tubular metallic liners 46C next to the memory cell area is independent of the thickness of the conformal metallic liners 46A adjoining the insulating layers 32. The thicker tubular metallic liners 46C provide additional diffusion barrier protection for the memory cell area without significantly increasing the resistance of the electrically conductive layer (e.g., word line) 46 because the word line resistance is much more significantly impacted by the thickness of the conformal metallic liners 46A (which are kept relatively thin) than the thickness of the tubular metallic liners 46C (which are made thicker).

Referring to FIG. 13C, a stack of layers including an optional blocking dielectric layer 52, a memory material layer 54, a tunneling dielectric layer 56, and an optional sacrificial cover material layer 601 can be sequentially deposited in the memory openings 49 by a respective conformal deposition process.

The optional blocking dielectric layer 52 can include a single dielectric material layer or a stack of a plurality of dielectric material layers. The blocking dielectric layer 52 can be formed employing a conformal deposition process. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the memory material layer 54 can be deposited as a continuous material layer by a conformal deposition process such as a chemical vapor deposition process or an atomic layer deposition process. The memory material layer 54 includes a memory material, i.e., a material that can store data by selecting a state of the material. For example, the memory material layer 54 may include a charge storage material such as silicon nitride, a ferroelectric material that can store information in the form of a ferroelectric polarization direction, or any other memory material that can store data by altering its electrical resistivity. The ferroelectric material may comprise orthorhombic phase hafnium oxide doped with silicon, aluminum or zirconium for example.

Referring to FIG. 13D, the optional sacrificial cover material layer 601, the tunneling dielectric layer 56, the memory material layer 54, and the blocking dielectric layer 52 overlying the insulating cap layer 70 are sequentially anisotropically etched employing at least one anisotropic etch process. The portions of the sacrificial cover material layer 601, the tunneling dielectric layer 56, the memory material layer 54, and the blocking dielectric layer 52 located above the top surface of the insulating cap layer 70 can be removed by the at least one anisotropic etch process. Further, the horizontal portions of the sacrificial cover material layer 601, the tunneling dielectric layer 56, the memory material layer 54, and the blocking dielectric layer 52 at a bottom of each memory cavity 49' can be removed to form openings in remaining portions thereof. Each of the sacrificial cover material layer 601, the tunneling dielectric layer 56, the memory material layer 54, and the blocking dielectric layer 52 can be etched by a respective anisotropic etch process employing a respective etch chemistry, which may, or may not, be the same for the various material layers The memory material layer 54 can be formed as a single memory material layer of homogeneous composition, or can include a stack of multiple memory material layers. In one embodiment, the memory material layer 54 may comprise an insulating charge trapping material, such as one or more silicon nitride segments. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The tunneling dielectric layer 56 includes a dielectric material. The tunneling dielectric layer 56 can be formed on the memory material layer 54 employing a conformal deposition process. In one embodiment, the tunneling dielectric layer 56 comprises a tunneling dielectric layer through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed. If the memory material layer 54 comprises a ferroelectric material rather than a charge storage material, then the tunneling dielectric layer 56 may be omitted or replaced with an insulating liner layer.

The optional sacrificial cover material layer 601 includes a sacrificial material that can be subsequently removed selective to the material of the tunneling dielectric layer 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Each remaining portion of the sacrificial cover material layer 601 can have a tubular configuration. The memory material layer 54 can comprise a charge trapping material, a ferroelectric material or a resistive memory material that can provide at least two different levels of resistivity (such as a phase change material), or any other memory material that can store information by a change in state. In one embodiment, each memory material layer 54 can include a vertical stack of charge storage regions that store electrical charge upon programming. In one embodiment, the memory material layer 54 can be a memory material layer in which each portion adjacent to the electrically conductive layers 46 constitutes the charge storage region.

A surface of the semiconductor material layer 10 can be physically exposed underneath the opening through the sacrificial cover material layer 601, the tunneling dielectric layer 56, the memory material layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the semiconductor material layer 10 by a recess distance. A tunneling dielectric layer 56 is located over the memory material layer 54. A set of a blocking dielectric layer 52, a memory material layer 54, and a tunneling dielectric layer 56 in a memory opening 49 constitutes a memory film 50, which may include a plurality of charge storage regions (comprising portions of the memory material layer 54) that are insulated from surrounding materials by the blocking dielectric layer 52 and the tunneling dielectric layer 56. In one embodiment, the sacrificial cover material layer 601, the tunneling dielectric layer 56, the memory material layer 54, and the blocking dielectric layer 52 can have vertically coincident sidewalls. The sacrificial cover material layer 601 can be subsequently removed selective to the material of the tunneling dielectric layer 56. In case the sacrificial cover material layer 601 includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer 601. Alternatively, the sacrificial cover material layer 601 may be retained in the final device if it comprises a semiconductor material.

Referring to FIG. 13E, a semiconductor channel layer 60L can be deposited directly on the semiconductor surface of the semiconductor material layer 10, and directly on the tunneling dielectric layer 56. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 10. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Referring to FIG. 13F, in case the memory cavity 49' in each memory opening is not completely filled by the semiconductor channel layer 60L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 13G, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the insulating cap layer 70. Each remaining portion of the dielectric core layer 62L constitutes a dielectric core 62.

Referring to FIG. 13H, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60. The vertical semiconductor channel 60 is formed directly on the tunneling dielectric layer 56.

A tunneling dielectric layer 56 is surrounded by a memory material layer 54, and laterally surrounds a portion of the vertical semiconductor channel 60. Each adjoining set of a blocking dielectric layer 52, a memory material layer 54, and a tunneling dielectric layer 56 collectively constitute a memory film 50, which can store electrical charges or ferroelectric polarization with a macroscopic retention time. In some embodiments, a blocking dielectric layer 52 may not be present in the memory film 50 at this step, and a backside blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the memory material layer 54, and an optional blocking dielectric layer 52. An entire set of material portions that fills a memory opening 49 is herein referred to as a memory opening fill structure 58. An entire set of material portions that fills a support opening 19 constitutes a support pillar structure.

Generally, a memory opening fill structure 58 can be formed in each memory opening 49. The memory opening fill structure 58 comprises an optional blocking dielectric layer 52, a memory material layer 54, an optional tunneling dielectric layer 56, and a vertical semiconductor channel 60. The tunneling dielectric layer 56 may laterally surround the vertical semiconductor channel 60. The memory material layer 54 can laterally surround the tunneling dielectric layer 56.

Generally, memory opening fill structures 58 can be formed in the cavities within the volumes of the memory openings 49. Each of the memory opening fill structures 58 comprises a respective vertical stack of memory elements which comprise portions of a memory material layer 54 located at levels of the electrically conductive layers 46. The vertical stacks of tubular metallic liners 46C are formed between horizontally extending portions of the conformal metallic liners 46A by conversion of the vertical portions of the conformal metallic liners 46A and/or the metallic fill material layers 46B.

FIGS. 14A and 14B illustrate sequential vertical cross-sectional views of a memory opening 49 within a first alternative configuration of the first exemplary structure according to the first embodiment of the present disclosure.

Referring to FIG. 14A, a selective metal deposition process can be performed on the first exemplary structure illustrated in FIGS. 12 and 13A. Generally, cylindrical surfaces of the conformal metallic liners 46A are physically exposed to the memory cavities and to the support cavities upon removal of the sacrificial memory opening fill structures 47 and the sacrificial support opening fill structures 17. The selective metal deposition process grows a second electrically conductive material that is different from the first electrically conductive material of the conformal metallic liners 46A only from the physically exposed surfaces of the electrically conducive layers 46 (such as the physically exposed surfaces of the conformal metallic liners 46A) without growth of the metal from dielectric surfaces such as the physically exposed surfaces of the insulating layers 32. Electrically conductive material that can be deposited employing a selective deposition process as the second electrically conductive material include, but are not limited to, ruthenium, ruthenium oxide, tungsten nitride, tungsten oxide, tungsten oxynitride, tungsten boronitride, molybdenum nitride, molybdenum oxide, molybdenum oxynitride, molybdenum boronitride, etc. In one embodiment, ruthenium or ruthenium oxide may be selectively grown from the physically exposed surfaces of the conformal metallic liners 46A by selective atomic layer deposition.

A vertical stacks of tubular metallic liners 46S can be formed by performing a selective deposition process that grows the second electrically conductive material from the physically exposed surfaces of the conformal metallic liners 46A. Generally, the conformal metallic liners 46A may comprise, and/or may consist essentially of, a first electrically conductive material, and the tubular metallic liners 46S may comprise, and/or may consist essentially of, a second electrically conductive material that is different from the first electrically conductive material. For example, if the conformal metallic liners 46A consists essentially of a metallic nitride material (such as TiN, TaN, or WN), then the tubular metallic liners 46S may consist essentially of an element metal that is different from any component of the conformal metallic liners 46A. The lateral thickness of the tubular metallic liners 46S may be in a range from 2 nm to 12 nm, such as from 3 nm to 8 nm, although lesser and greater thicknesses can also be employed. Vertical stacks of tubular metallic liners 46S are formed in the electrically conductive layers 46. As such, the vertical stacks of tubular metallic liners 46S are incorporated into the electrically conductive layers 46. The tubular metallic liners 46S are vertical liners just as the tubular metallic liners 46C

Referring to FIG. 14B, the processing steps of FIGS. 13C-13H can be performed to form a memory opening fill structure 58 within each memory opening 49 and to form a support pillar structure 20 within each support opening 19.

FIGS. 15A and 15B illustrate sequential vertical cross-sectional views of a memory opening within a second alternative configuration of the first exemplary structure according to the first embodiment of the present disclosure.

Referring to FIG. 15A, a nitridation process and/or an oxidation process can be performed on the first exemplary structure illustrated in FIGS. 12 and 13A. Nitrogen atoms or oxygen atoms can diffuse through the conformal metallic liners 46A into the tubular portions of the metallic fill material layers 46B that are proximal to the memory openings 49 or to the support openings 19. The tubular portions of the metallic fill material layers 46B are converted into the second electrically conductive material, which may comprise a conductive nitride or a conductive oxide of the material of the metallic fill material layer 46B. For example, if the metallic fill material layer 46B comprises tungsten or molybdenum, then the second electrically conductive material may comprise tungsten nitride, tungsten oxide, tungsten oxynitride, molybdenum nitride, molybdenum oxide or molybdenum oxynitride.

A vertical stack of tubular metallic liners 46D can be formed around each memory opening 49 and around each support opening 19 by conversion of tubular portions of the metallic fill material layers 46B that are proximal to these openings into the second electrically conductive material by nitridation or by oxidation. The second electrically conductive material is a metallic compound material such as a metal nitride material, a metal oxide material or a metal oxynitride material. In this case, nitrogen atoms or oxygen atoms diffuse through the cylindrical portions of the conformal metallic liners 46A. In case the conformal metallic liners 46A include a same non-metallic element as the diffusing species (such as nitrogen atoms and/or oxygen atoms) employed during the conversion process, then the material composition of the conformal metallic liners 46A does not change during the conversion process. For example, if the conformal metallic liners 46A comprises a first metallic nitride material and if the conversion process comprises a nitridation process, then the material composition of the conformal metallic liners 46A does not change during formation of the tubular metallic liners 46D. The vertical stacks of tubular metallic liners 46D are formed in the electrically conductive layers 46, and as such, the vertical stacks of tubular metallic liners 46D are incorporated into the electrically conductive layers 46. The tubular metallic liners 46D are vertical liners just as the tubular metallic liners 46C or 46S.

Referring to FIG. 15B, the processing steps of FIGS. 13C-13H can be performed to form a memory opening fill structure 58 within each memory opening 49 and to form a support pillar structure 20 within each support opening 19.

FIGS. 16A and 16B illustrate sequential vertical cross-sectional views of a memory opening within a third alternative configuration of the first exemplary structure according to the first embodiment of the present disclosure.

Referring to FIG. 16A, a nitridation process or an oxidation process can be performed on the first exemplary structure illustrated in FIGS. 12 and 13A. Nitrogen atoms and/or oxygen atoms can diffuse into and through the conformal metallic liners 46A into the tubular portions of the metallic fill material layers 46B that are proximal to the memory openings 49 or to the support openings 19. The tubular portions of both the conformal metallic liners 46A and the metallic fill material layers 46B are converted into a second electrically conductive material, which may comprise a conductive nitride, a conductive oxide or a conductive oxynitride of the material of the metallic fill material layer 46B.

A vertical stack of laterally adjacent tubular metallic liners 46C and 46D described above can be formed around each memory opening 49 and around each support opening 19 by conversion of tubular portions of the respective conformal metallic liners 46A and metallic fill material layers 46B that are proximal to these openings into the second electrically conductive material by nitridation and/or by oxidation. The second electrically conductive material is a metallic compound material such as a metal nitride material, a metal oxide material or a metal oxynitride material. In case the conformal metallic liners 46A include a different non-metallic element from the diffusing species (such as nitrogen atoms or oxygen atoms) employed during the conversion process, cylindrical portions of the conformal metallic liners 46A may be converted into additional tubular metallic liners 46C, which are herein referred to as inner tubular metallic liners 46C. In this case, the tubular metallic liners 46D that are formed by conversion of tubular portions of the metallic fill material layers 46B are referred to as outer tubular metallic liners 46D. For example, if the conformal metallic liners 46A comprises a first metallic nitride material and if the conversion process comprises an oxidation process, then the inner tubular metallic liners 46C may comprise a metal oxide and or a metal oxynitride including the same metal as the conformal metallic liners 46A and oxygen atoms, and the outer tubular metallic liners 46D may comprise a metal oxide material including the elemental metal contained within the metallic fill material layers 46B. For example, the inner tubular metallic liners 46C may comprise tungsten oxide, tungsten oxynitride or titanium oxynitride, if the conformal metallic liners 46A comprise tungsten nitride or titanium nitride. The vertical stacks of outer tubular metallic liners 46D and the vertical stack of the inner tubular metallic liners 46C are formed in the electrically conductive layers 46, and as such, are incorporated into the electrically conductive layers 46.

Referring to FIG. 16B, the processing steps of FIGS. 13C-13H can be performed to form a memory opening fill structure 58 within each memory opening 49 and to form a support pillar structure 20 within each support opening 19.

Figure 17:
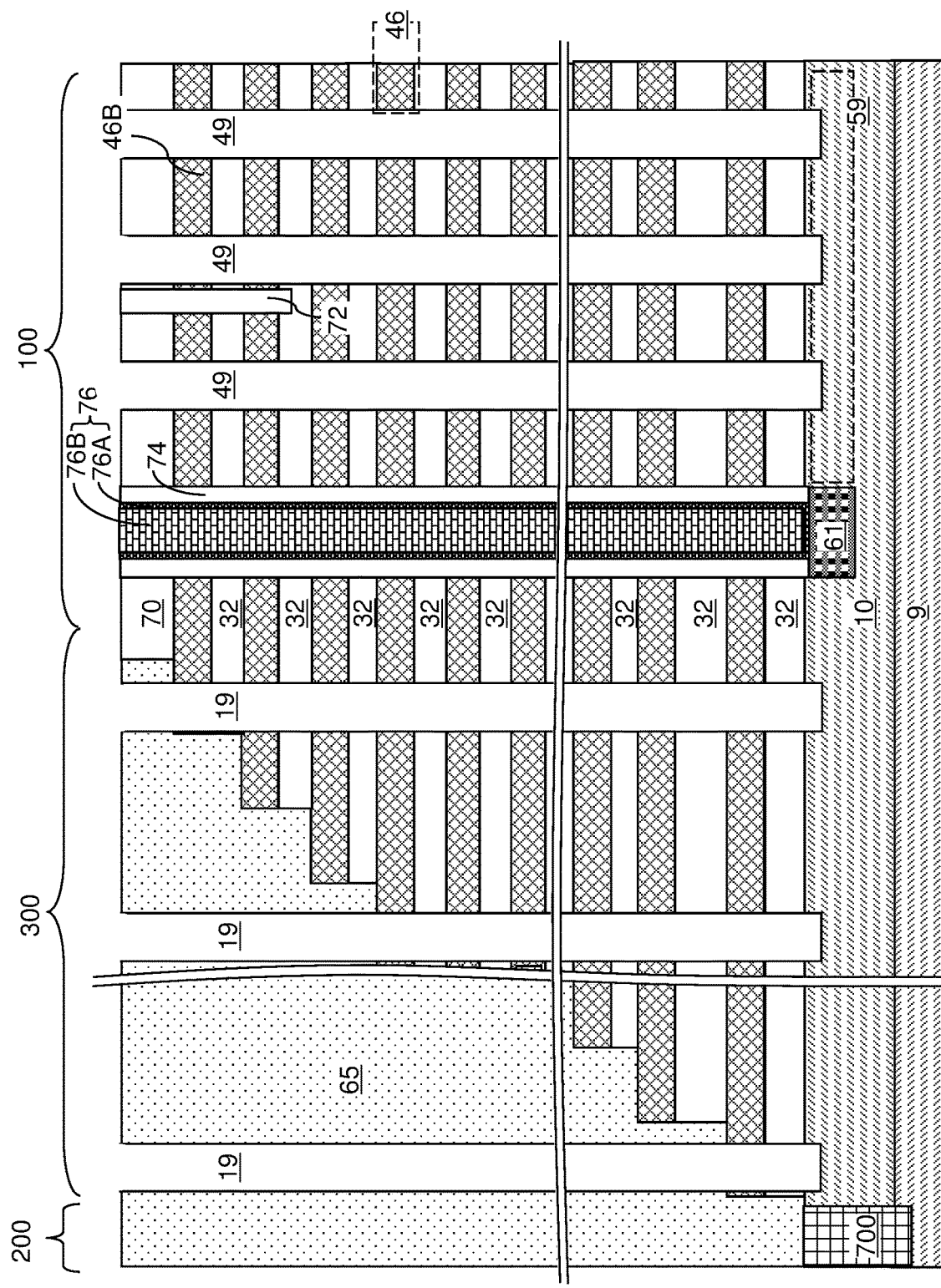
FIG. 17 is a schematic vertical cross-sectional view of a fourth alternative configuration of the first exemplary structure after removal of the memory opening fill structures and the sacrificial support opening fill structures according to the first embodiment of the present disclosure.

Referring to FIG. 17, a fourth alternative configuration of the first exemplary structure is illustrated at a processing step that corresponds to the processing steps of FIG. 12, i.e., after removal of the sacrificial memory opening fill structures 47 and the sacrificial support opening fill structures 17. The fourth alternative configuration of the first exemplary structure can be derived from the first exemplary structure of FIG. 12 by omitting the processing step that forms the conformal metallic liners 46A, i.e., by omitting the processing steps of FIG. 8. Thus, the metallic fill material layers 46B can be deposited directly on surfaces of the insulating layers 32 and physically exposed cylindrical surface segments of the sacrificial memory opening fill structures 47 and the sacrificial support opening fill structures 17.

Figures 18A, 18B:
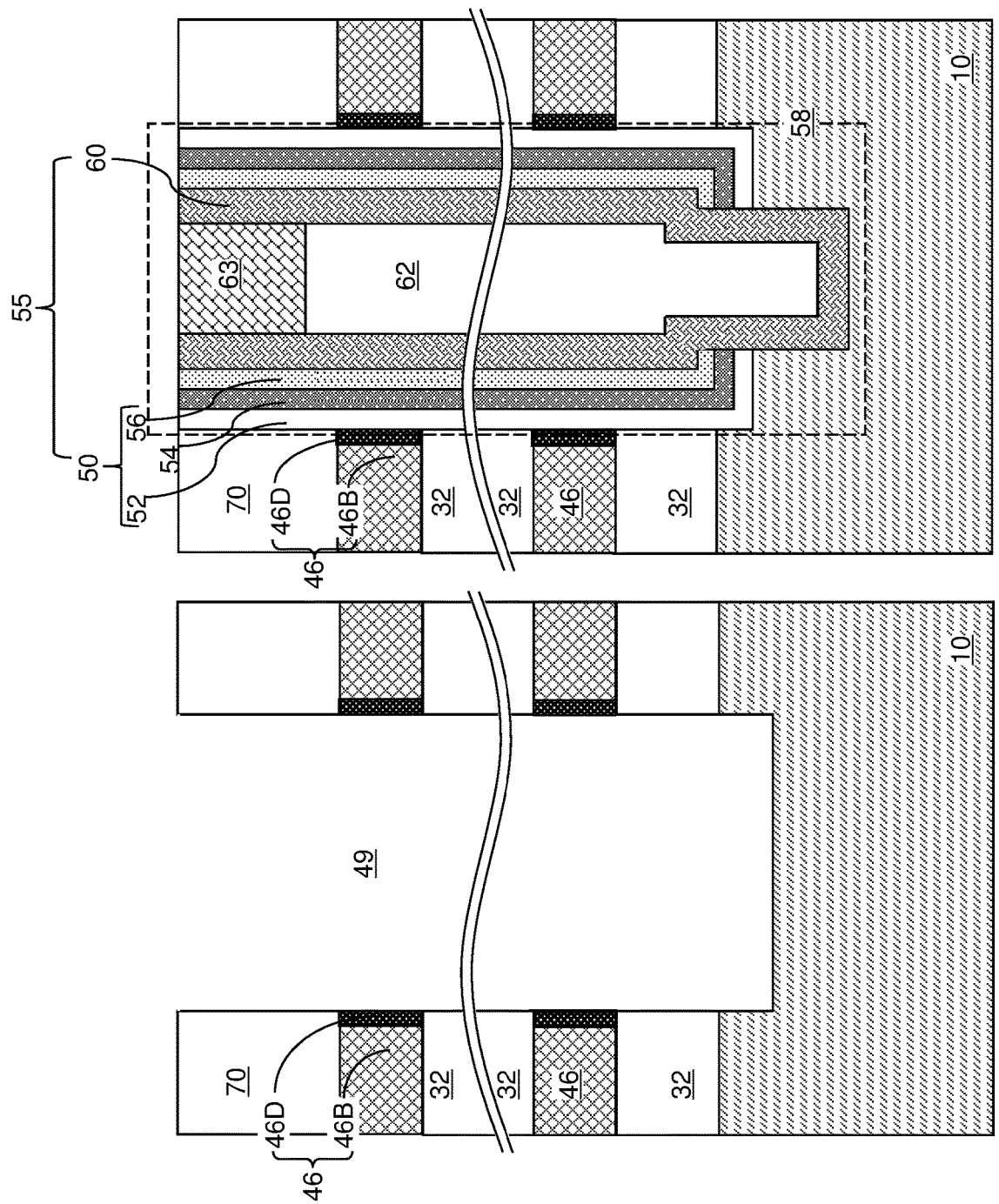
FIGS. 18A and 18B are sequential schematic vertical cross-sectional views of a memory opening within the fourth alternative configuration of the first exemplary structure during formation of a memory stack structure, an optional dielectric core, and a drain region therein according to the first embodiment of the present disclosure.

FIGS. 18A and 18B are sequential schematic vertical cross-sectional views of a memory opening 49 within the fourth alternative configuration of the first exemplary structure during formation of a memory stack structure 55, an optional dielectric core 62, and a drain region 63 therein.

Referring to FIG. 18A, physically exposed cylindrical surfaces of the metallic fill material layers 46B may be optionally laterally recessed around the memory openings 49 and around the support openings 19. In one embodiment, tubular portions of the metallic fill material layers 46B that are proximal to the memory openings 49 or to the support openings 19 may be removed by performing an isotropic etch process by providing an isotropic etchant into the memory openings 49 and the support openings 19. The lateral recess distance may be in a range from 2 nm to 12 nm, such as from 4 nm to 8 nm, although lesser and greater lateral recess distances may also be employed.

A thermal conversion process, a plasma conversion process, or a gas phase doping process can be performed to convert physically exposed surface portions of the metallic fill material layers 46B into tubular metallic liners 46D. The process that may be performed at this processing step includes a nitridation process, an oxidation process, or incorporation of boron atoms, as described above.

A vertical stack of tubular metallic liners 46D can be formed by conversion of tubular portions of the metallic fill material layers 46B that are physically exposed to the memory opening 49. Generally, the metallic fill material layers 46B may comprise, and/or may consist essentially of, a first electrically conductive material such as an elemental metal, and the tubular metallic liners 46D may comprise, and/or may consist essentially of, a second electrically conductive material that is different from the first electrically conductive material by incorporation of nitrogen, oxygen, or boron. For example, if the metallic fill material layers 46B consists essentially of tungsten or molybdenum, then the tubular metallic liners 46D may comprise tungsten nitride, tungsten oxide, tungsten oxynitride, tungsten boronitride, molybdenum nitride, molybdenum oxide, molybdenum oxynitride, or molybdenum boronitride.

The entirety of cylindrical portions of the metallic fill material layers 46B around the memory opening 49 may be converted into a vertical stack of tubular metallic liners 46D. Inner sidewalls of the tubular metallic liners 46D may be flush with, may be laterally recessed outward relative to, or may protrude inward relative to, sidewalls of the insulating layers 32 in the memory opening 49. The lateral thickness of the tubular metallic liners 46D may be in a range from 2 nm to 12 nm, such as from 3 nm to 8 nm, although lesser and greater thicknesses can also be employed. Vertical stacks of tubular metallic liners 46D are formed in the electrically conductive layers 46. As such, the vertical stacks of tubular metallic liners 46D are incorporated into the electrically conductive layers 46. The tubular metallic liners 46D are vertical liners just as the tubular metallic liners 46C or 46S described above.

Referring to FIG. 18B, the processing steps of FIGS. 13C-13H can be performed to form a memory opening fill structure 58 within each memory opening 49 and to form a support pillar structure 20 within each support opening 19.

FIGS. 19A and 19B are sequential schematic vertical cross-sectional views of a memory opening within a fifth alternative configuration of the first exemplary structure during formation of a memory stack structure 55, an optional dielectric core 62, and a drain region 63 therein.

Referring to FIG. 19A, physically exposed cylindrical surfaces of the metallic fill material layers 46B may be optionally laterally recessed around the memory openings 49 and around the support openings 19. In one embodiment, tubular portions of the metallic fill material layers 46B that are proximal to the memory openings 49 or to the support openings 19 may be removed by performing an isotropic etch process by providing an isotropic etchant into the memory openings 49 and the support openings 19. The lateral recess distance may be in a range from 2 nm to 12 nm, such as from 4 nm to 8 nm, although lesser and greater lateral recess distances may also be employed.

A selective metal or metal oxide deposition process can be performed. Generally, cylindrical surfaces of the metallic fill material layers 46B are physically exposed prior to initiation of the selective deposition process. The selective deposition process grows a second electrically conductive material that is different from the first electrically conductive material of the metallic fill material layers 46B only from the physically exposed surfaces of the electrically conductive layers 46 (such as the physically exposed surfaces of the metallic fill material layers 46B) without growth of the metal from dielectric surfaces such as the physically exposed surfaces of the insulating layers 32. Electrically conductive material that can be deposited employing a selective deposition process as the second electrically conductive material include, but are not limited to, ruthenium, ruthenium oxide, tungsten nitride, tungsten oxide, tungsten oxynitride, tungsten boronitride, molybdenum nitride, molybdenum oxide, molybdenum oxynitride, molybdenum boronitride, etc. In one embodiment, ruthenium or ruthenium oxide may be selectively grown from the physically exposed surfaces of the metallic fill material layers 46B by selective atomic layer deposition.

A vertical stack of tubular metallic liners 46S can be formed by performing a selective deposition process that grows the second electrically conductive material from the physically exposed surfaces of the metallic fill material layers 46B. Generally, the metallic fill material layers 46B may comprise, and/or may consist essentially of, a first electrically conductive material, and the tubular metallic liners 46S may comprise, and/or may consist essentially of, a second electrically conductive material that is different from the first electrically conductive material. The lateral thickness of the tubular metallic liners 46S may be in a range from 2 nm to 12 nm, such as from 3 nm to 8 nm, although lesser and greater thicknesses can also be employed. Vertical stacks of tubular metallic liners 46S are formed in the electrically conductive layers 46. As such, the vertical stacks of tubular metallic liners 46S are incorporated into the electrically conductive layers 46. The tubular metallic liners 46D are vertical liners as described above.

Figure 20A:
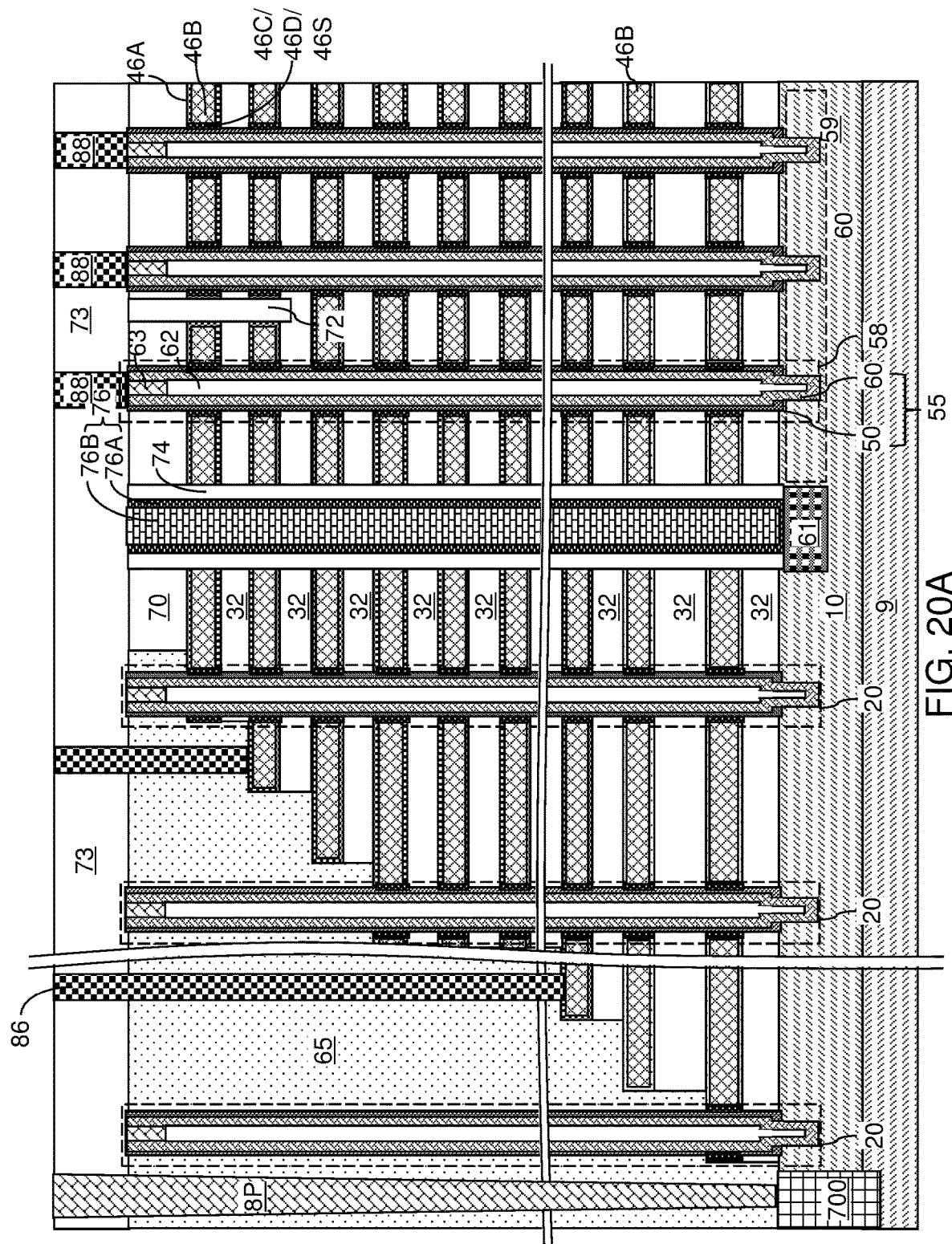
FIG. 20A is a schematic vertical cross-sectional view of the first exemplary structure after formation of a contact-level dielectric layer and additional contact via structures according to the first embodiment of the present disclosure.
Figure 20B:
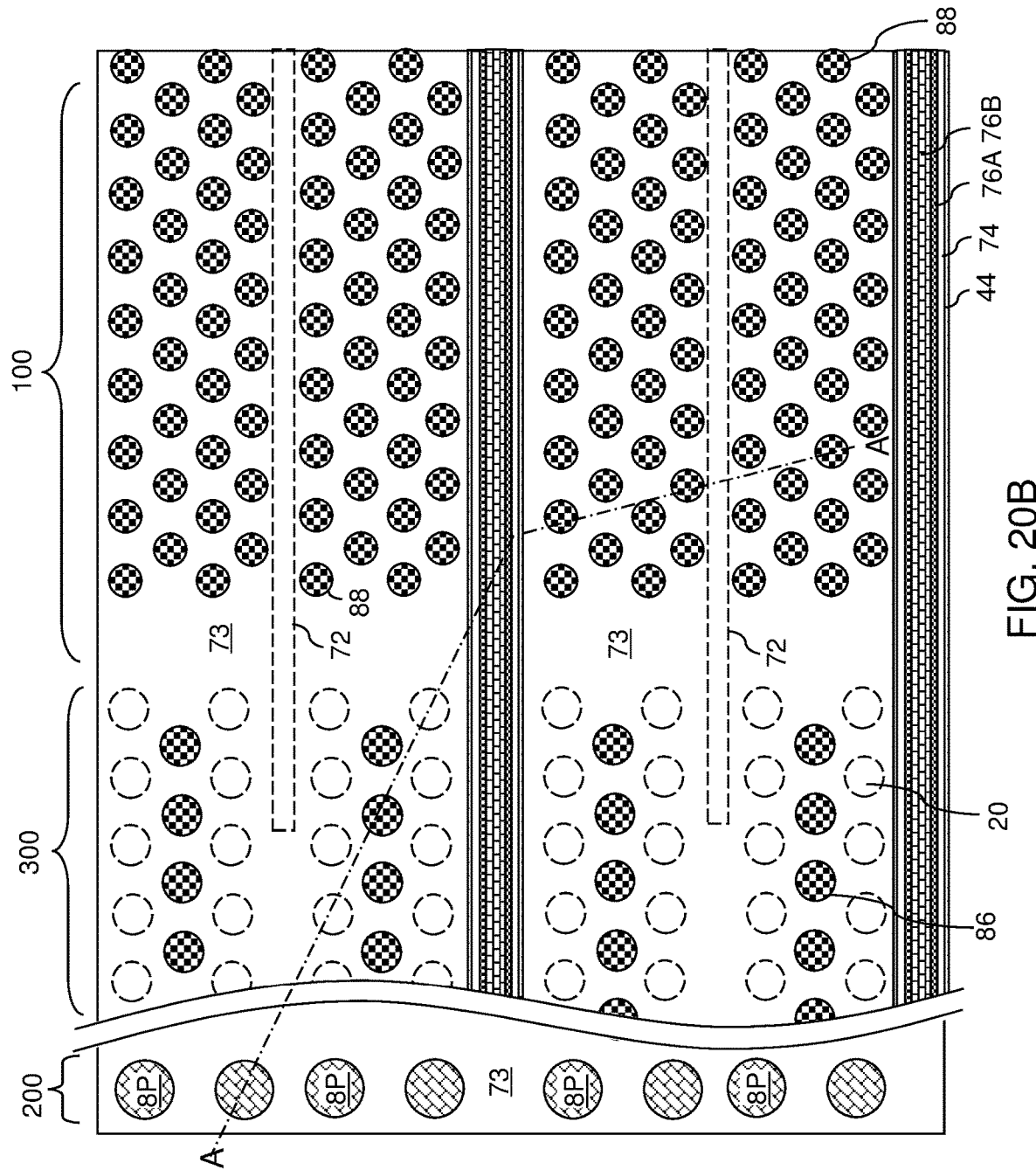
FIG. 20B is a partial see-through top-down view of the first exemplary structure of FIG. 20A. The vertical plane A-A' is the plane of the schematic vertical cross-sectional view of FIG. 20A.

Referring to FIGS. 20A and 20B, a contact-level dielectric layer 73 can be deposited over the insulating cap layer 70, the retro-stepped dielectric material portion 65, the memory opening fill structures 58, and the support pillar structures 20.

Additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices.

Figure 21:
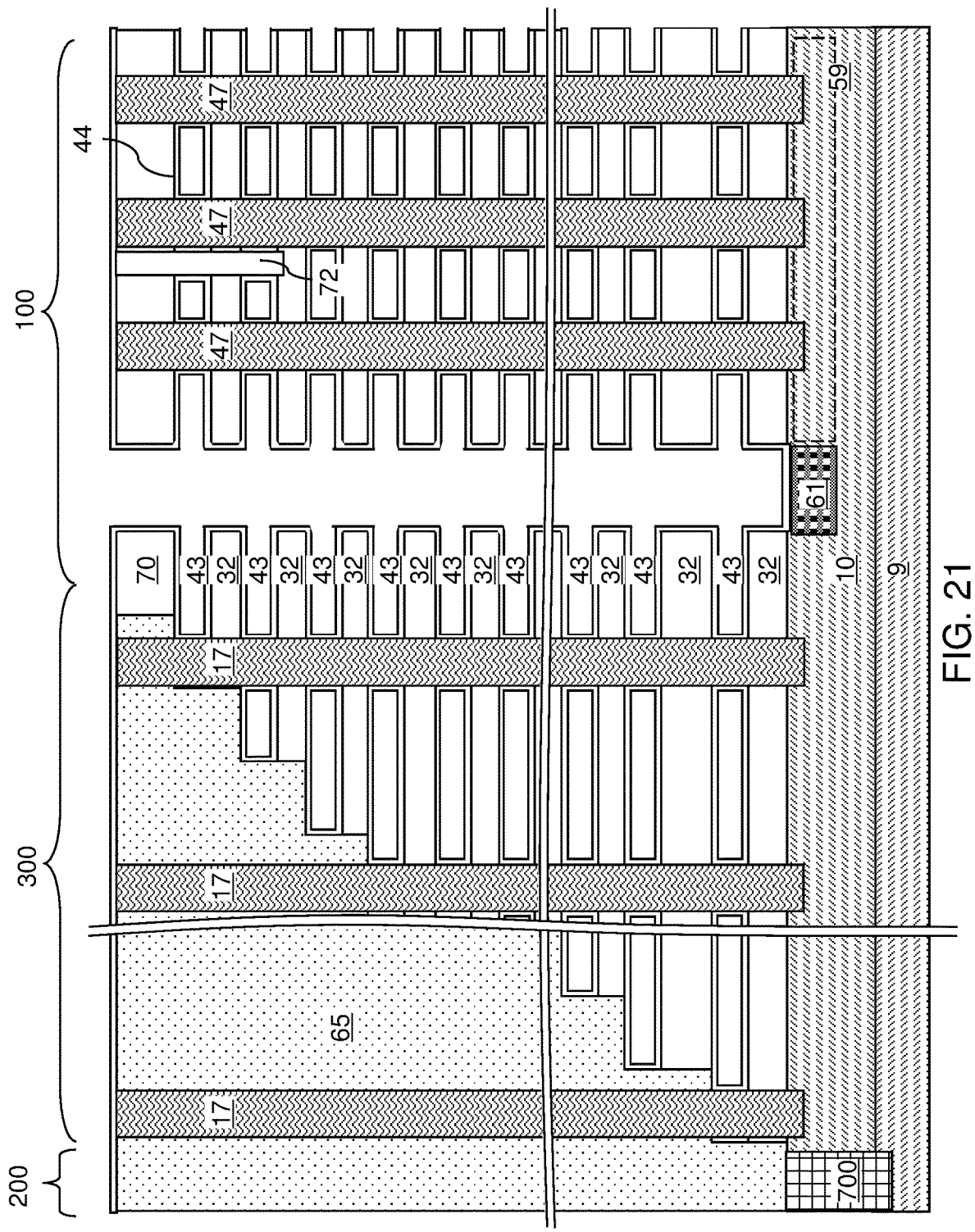
FIG. 21 is a schematic vertical cross-sectional view of a second exemplary structure after formation of a backside blocking dielectric layer according to a second embodiment of the present disclosure.

Referring to FIG. 21, a second exemplary structure according to a second embodiment of the present disclosure can be derived from the first exemplary structure illustrated in FIG. 7 by conformally depositing a backside blocking dielectric layer 44. The backside blocking dielectric layer 44 comprises a dielectric material that functions as a component of a control gate dielectric for the control gates to be subsequently formed in the backside recesses 43. The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the sacrificial memory opening fill structures 47 and the sacrificial support opening fill structures 17 that are exposed to the backside recesses 43. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. In one embodiment, the backside blocking dielectric layer 44 can consist essentially of aluminum oxide. The backside blocking dielectric layer 44 can be deposited by a conformal deposition method such as chemical vapor deposition or atomic layer deposition. A backside cavity is present within the portion of each backside trench 79 that is not filled with the backside blocking dielectric layer 44.

Figure 22:
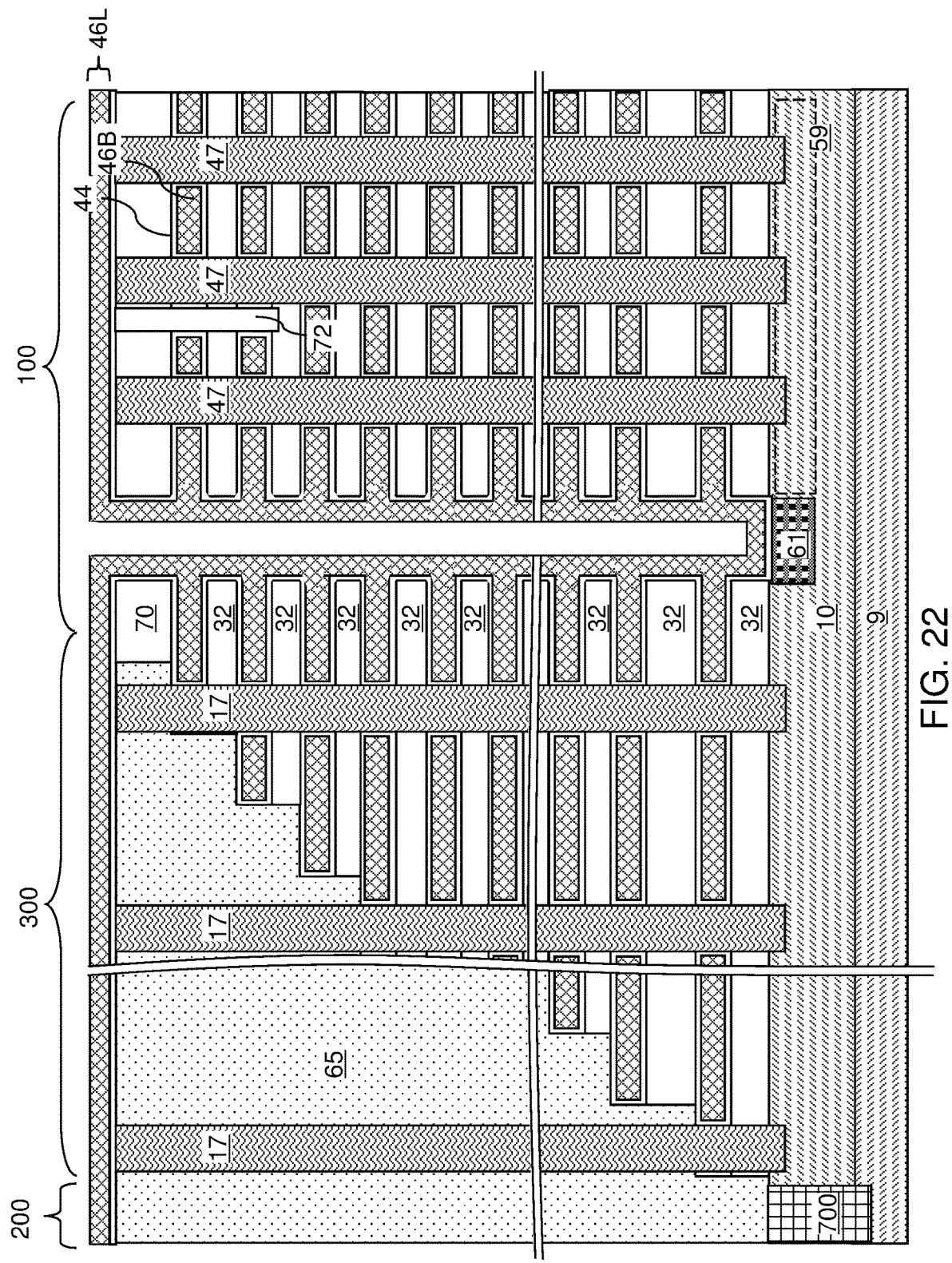
FIG. 22 is a schematic vertical cross-sectional view of the second exemplary structure after formation of a metallic fill material layer comprising a second electrically conductive material according to the second embodiment of the present disclosure.

Referring to FIG. 22, a metal fill material is deposited in the plurality of backside recesses 43, over the sidewalls of the at least one the backside trench 79, and over the top surface of the insulating cap layer 70 and directly on physically exposed surfaces of the backside blocking dielectric layer 44 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, molybdenum, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the backside blocking dielectric layer 44, which at least partially blocks diffusion of fluorine atoms therethrough.

A plurality of electrically conductive layers 46 can be formed in the plurality of backside recesses 43, and a continuous electrically conductive material layer 46L can be formed on the sidewalls of each backside trench 79 and over the insulating cap layer 70. Each electrically conductive layer 46 includes a portion of the metallic fill material layer 46B that are located between a vertically neighboring pair of dielectric material layers such as a pair of insulating layers 32. The continuous electrically conductive material layer 46L includes a continuous portion of the metallic fill material layer 46B that are located in the backside trenches 79 or above the insulating cap layer 70. Each sacrificial material layer 42 can be replaced with an electrically conductive layer 46. A backside cavity is present in the portion of each backside trench 79 that is not filled with the continuous electrically conductive material layer 46L.

Figure 23:
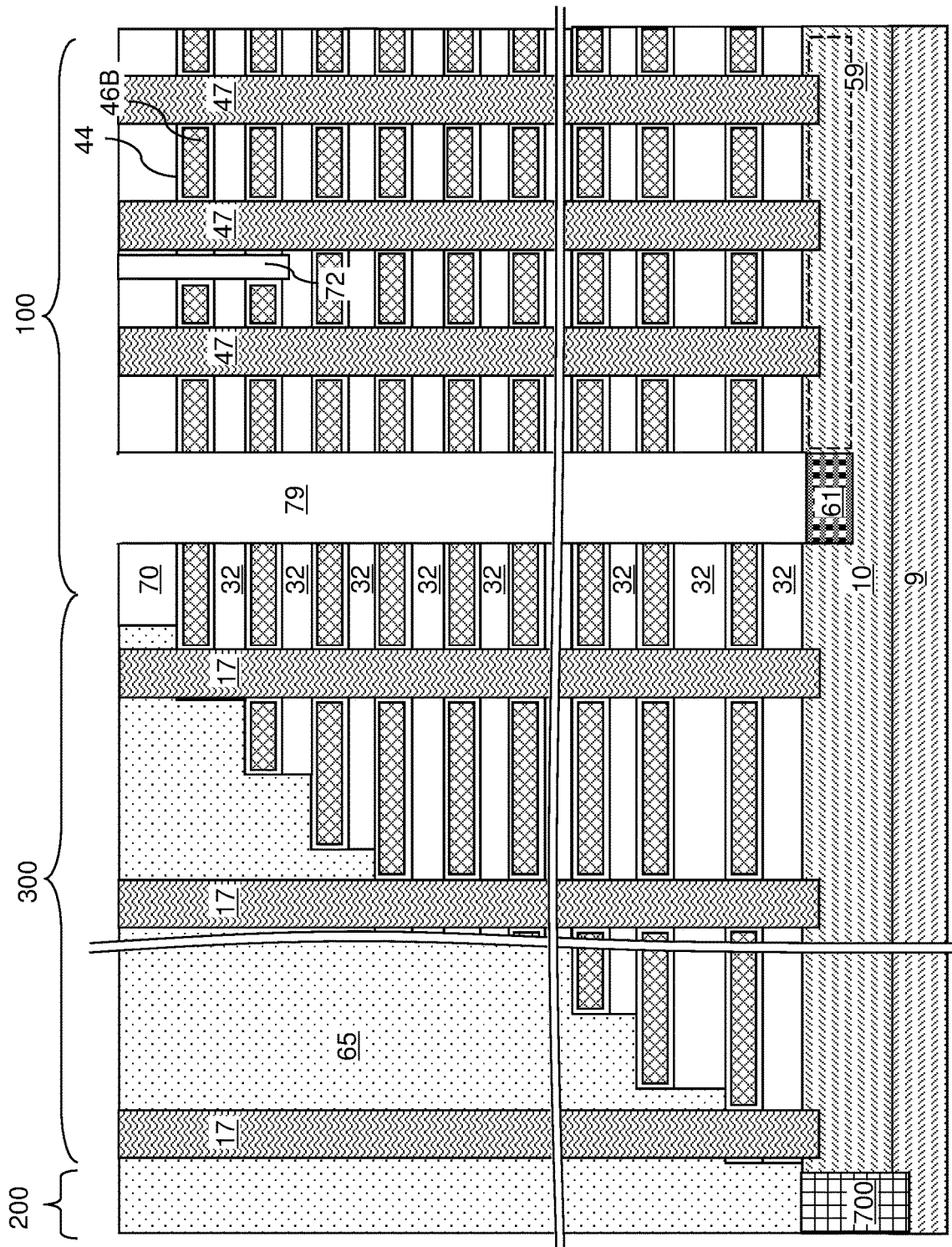
FIG. 23 is a schematic vertical cross-sectional view of the second exemplary structure after removal of electrically conductive materials from inside the backside trenches according to the second embodiment of the present disclosure.

Referring to FIG. 23, the deposited electrically conductive material of the continuous electrically conductive material layer 46L is etched back from the sidewalls of each backside trench 79 and from above the insulating cap layer 70, for example, by an isotropic wet etch, an anisotropic dry etch, or a combination thereof. Portions of the backside blocking dielectric layer 44 that overlie the insulating cap layer 70 or located within the backside trenches 79 can be removed collaterally during removal of the continuous electrically conductive material layer 46L or by performing an additional etch process, which may employ an isotropic etch process (such as a wet etch process) and/or an anisotropic etch process (such as a reaction ion etch process). Each remaining portion of the deposited electrically conductive material in the backside recesses 43 constitutes an electrically conductive layer 46. Each electrically conductive layer 46 can be a conductive line structure. Thus, the sacrificial material layers 42 are replaced with the electrically conductive layers 46. Generally, electrically conductive layers 46 can be formed in the backside recesses 43 such that each of the electrically conductive layers 46 comprises a metallic fill material layer 46B.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

Figure 24:
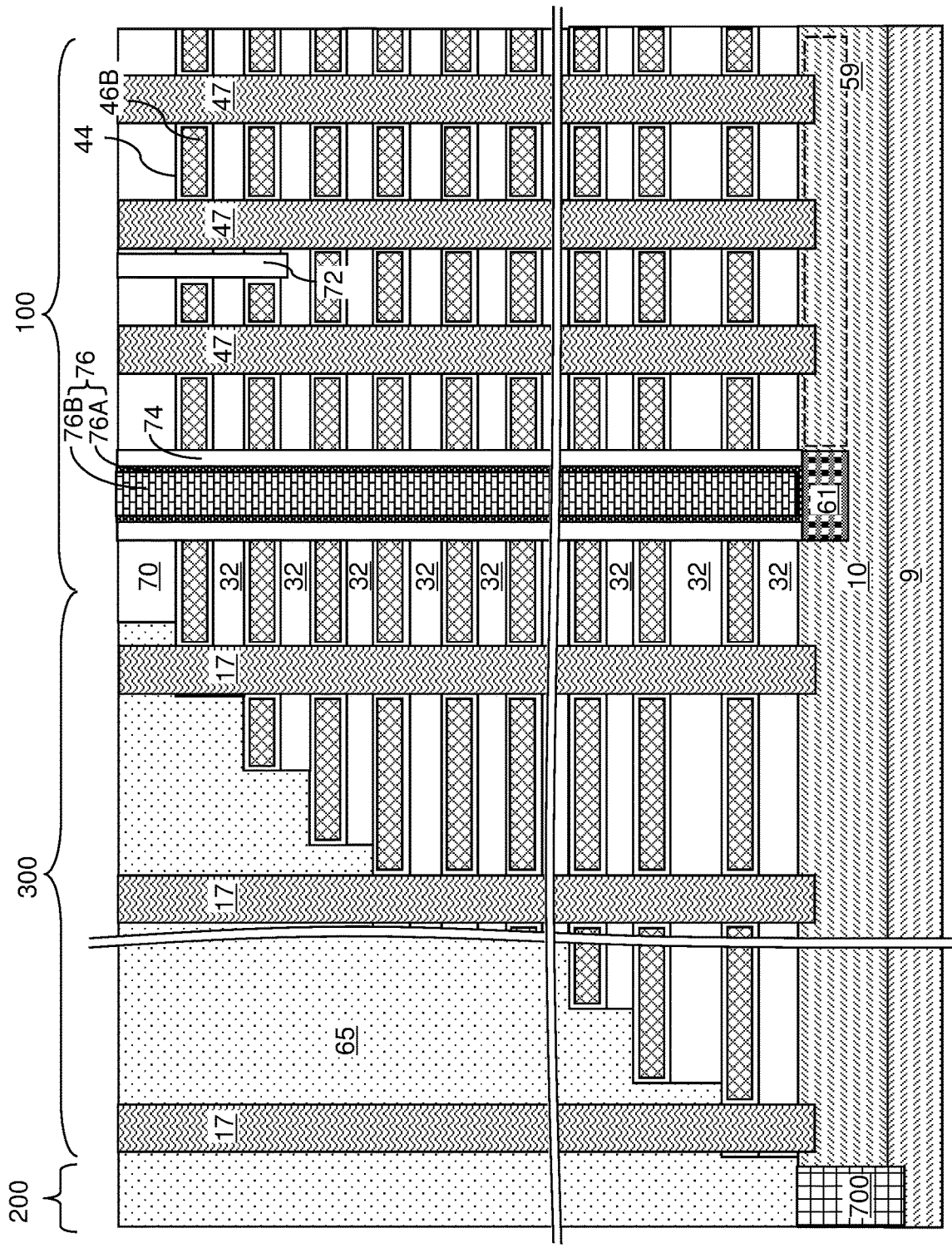
FIG. 24 is a schematic vertical cross-sectional view of the second exemplary structure after formation of an insulating spacer and a backside contact structure according to the second embodiment of the present disclosure.

Referring to FIG. 24, the processing steps of FIG. 11 can be performed to form an insulating spacer 74 and an optional backside contact via structure 76 within each backside trench 79. Subsequently, the processing steps of FIG. 12 can be performed to remove the sacrificial memory opening fill structures 47 and the sacrificial support opening fill structures 17.

FIGS. 25A-25H are sequential schematic vertical cross-sectional views of a memory opening within the second exemplary structure during formation of a memory stack structure, an optional dielectric core, and a drain region therein according to the second embodiment of the present disclosure.

Referring to FIG. 25A, a memory opening 49 in the second exemplary structure is illustrated after removal of a sacrificial memory opening fill structure 47 therefrom. The memory opening 49 extends through the insulating cap layer 70, the alternating stack (32, 46), and optionally into an upper portion of the semiconductor material layer 10. At this processing step, each support opening 19 can extend through the retro-stepped dielectric material portion 65, a subset of layers in the alternating stack (32, 46), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed.

Referring to FIG. 25B, a thermal conversion process, a plasma conversion process, or a gas phase doping process can be performed to convert cylindrical portions of the metallic fill material layers 46B that are proximal to the memory openings 49 or to the support openings 19 into tubular metallic liners 46D. The conversion process that may be performed at this processing step includes a nitridation process, an oxidation process, or incorporation of boron atoms described above with respect to the first embodiment. The nitrogen, oxygen and/or boron atoms or ions may diffuse through the exposed vertical portions of the backside blocking dielectric layer 44 to react with the vertical portion of the metallic fill material layers 46B.

A vertical stack of tubular metallic liners 46D can be formed by conversion of tubular portions of the metallic fill material layers 46B that are proximal to the memory cavity 49', which is the void within the volume of the memory opening 49. Generally, the metallic fill material layers 46B may comprise, and/or may consist essentially of, a first electrically conductive material, and the tubular metallic liners 46D may comprise, and/or may consist essentially of, a second electrically conductive material that is different from the first electrically conductive material by incorporation of nitrogen atoms, oxygen atoms, and/or boron atoms. For example, if the metallic fill material layer 46B comprises tungsten or molybdenum, then the second electrically conductive material may comprise tungsten nitride, tungsten oxide, tungsten oxynitride, tungsten boronitride, molybdenum nitride, molybdenum oxide, molybdenum oxynitride or molybdenum boronitride. The lateral thickness of the tubular metallic liners 46D may be in a range from 2 nm to 12 nm, such as from 3 nm to 8 nm, although lesser and greater thicknesses can also be employed. Vertical stacks of tubular metallic liners 46D are formed in the electrically conductive layers 46. As such, the vertical stacks of tubular metallic liners 46D are incorporated into the electrically conductive layers 46. The tubular metallic liners 46D are vertical liners as described above with respect to the first embodiment.

Referring to FIG. 25C, the processing steps of FIG. 13C can be performed to form a stack of layers including an optional blocking dielectric layer 52, a memory material layer 54, a tunneling dielectric layer 56, and an optional sacrificial cover material layer 601 in the memory openings 49 and in the support openings 19.

Referring to FIG. 25D, the processing steps of FIG. 13D can be performed to anisotropically etch horizontally-extending portions of the optional sacrificial cover material layer 601, the tunneling dielectric layer 56, the memory material layer 54, and the blocking dielectric layer 52. A surface of the semiconductor material layer 10 can be physically exposed underneath the opening through the sacrificial cover material layer 601, the tunneling dielectric layer 56, the memory material layer 54, and the blocking dielectric layer 52.

Referring to FIG. 25E, the processing steps of FIG. 13E can be performed to deposit a semiconductor channel layer 60L directly on the semiconductor surface of the semiconductor material layer 10, and on the tunneling dielectric layer 56.

Referring to FIG. 25F, the processing steps of FIG. 13F can be performed to deposit a dielectric core layer 62L, which can fill any remaining unfilled volume in the memory openings 49 and in the support openings 19.

Referring to FIG. 25G, the processing steps of FIG. 13G can be performed to form a dielectric core 62 within each of the memory openings 49 and within each of the support openings 19.

Referring to FIG. 25H, the processing steps of FIG. 13H can be performed to form a drain region 63 within each of the memory openings 49 and within each of the support openings 19.

Figure 26:
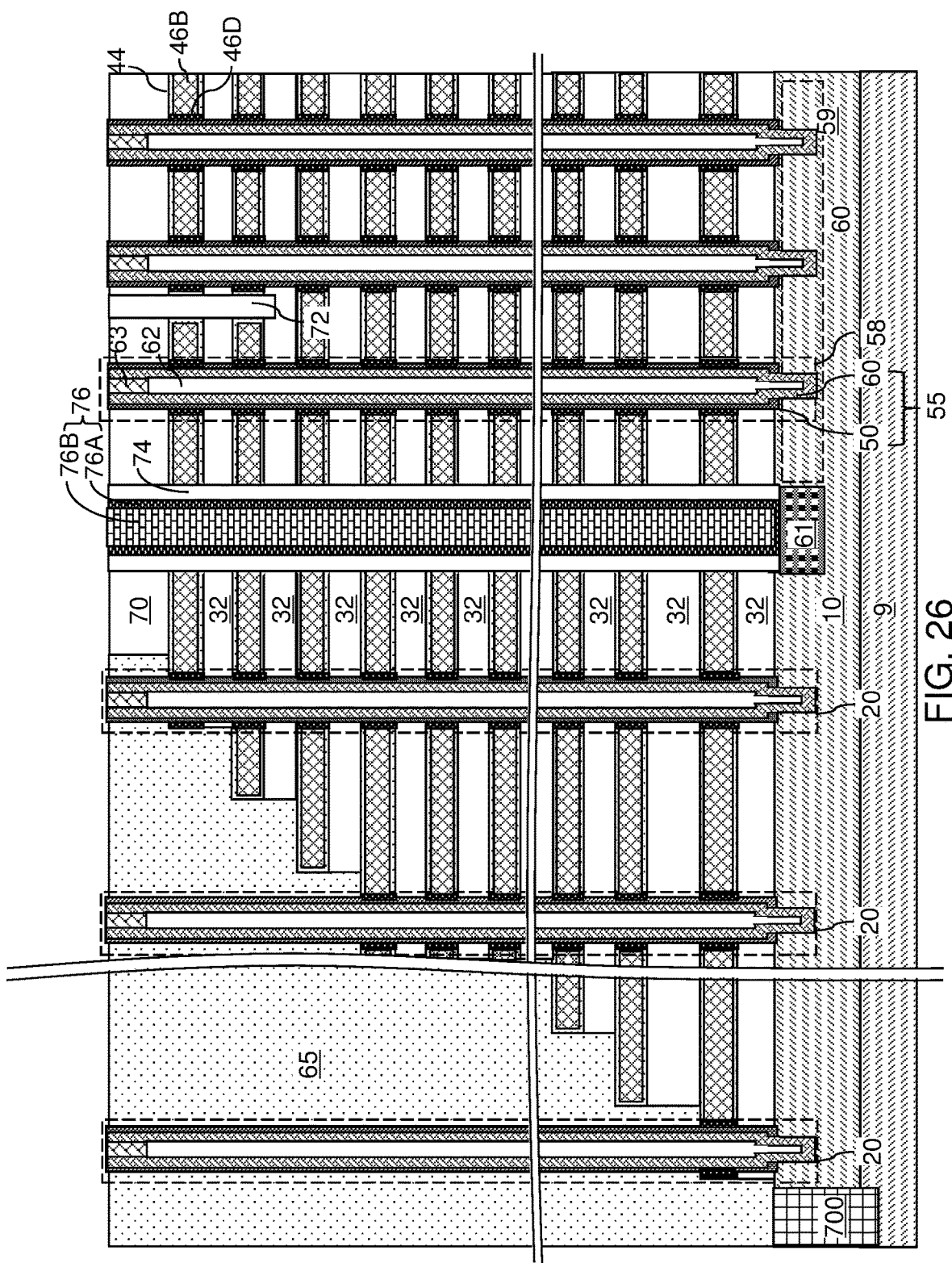
FIG. 26 is a schematic vertical cross-sectional view of the second exemplary structure after formation of memory opening fill structures and support pillar structures according to the second embodiment of the present disclosure.

Referring to FIG. 26, the second exemplary structure is illustrated after the processing steps of FIG. 25H. Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements comprising portions of the memory material layer 54, and an optional blocking dielectric layer 52. An entire set of material portions that fills a memory opening 49 is herein referred to as a memory opening fill structure 58. An entire set of material portions that fills a support opening 19 constitutes a support pillar structure.

Figure 27A:
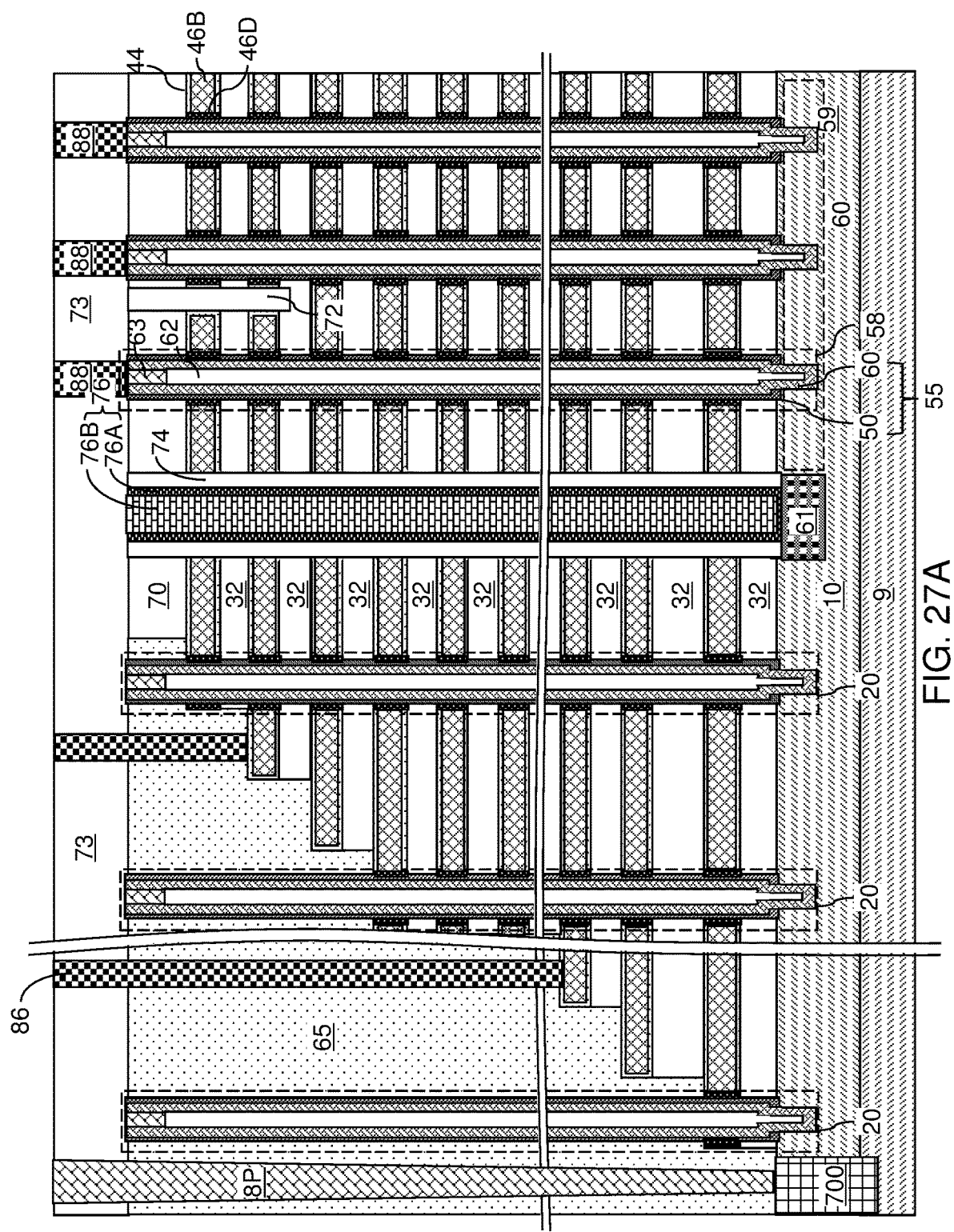
FIG. 27A is a schematic vertical cross-sectional view of the second exemplary structure after formation of a contact-level dielectric layer and additional contact via structures according to the second embodiment of the present disclosure.
Figure 27B:
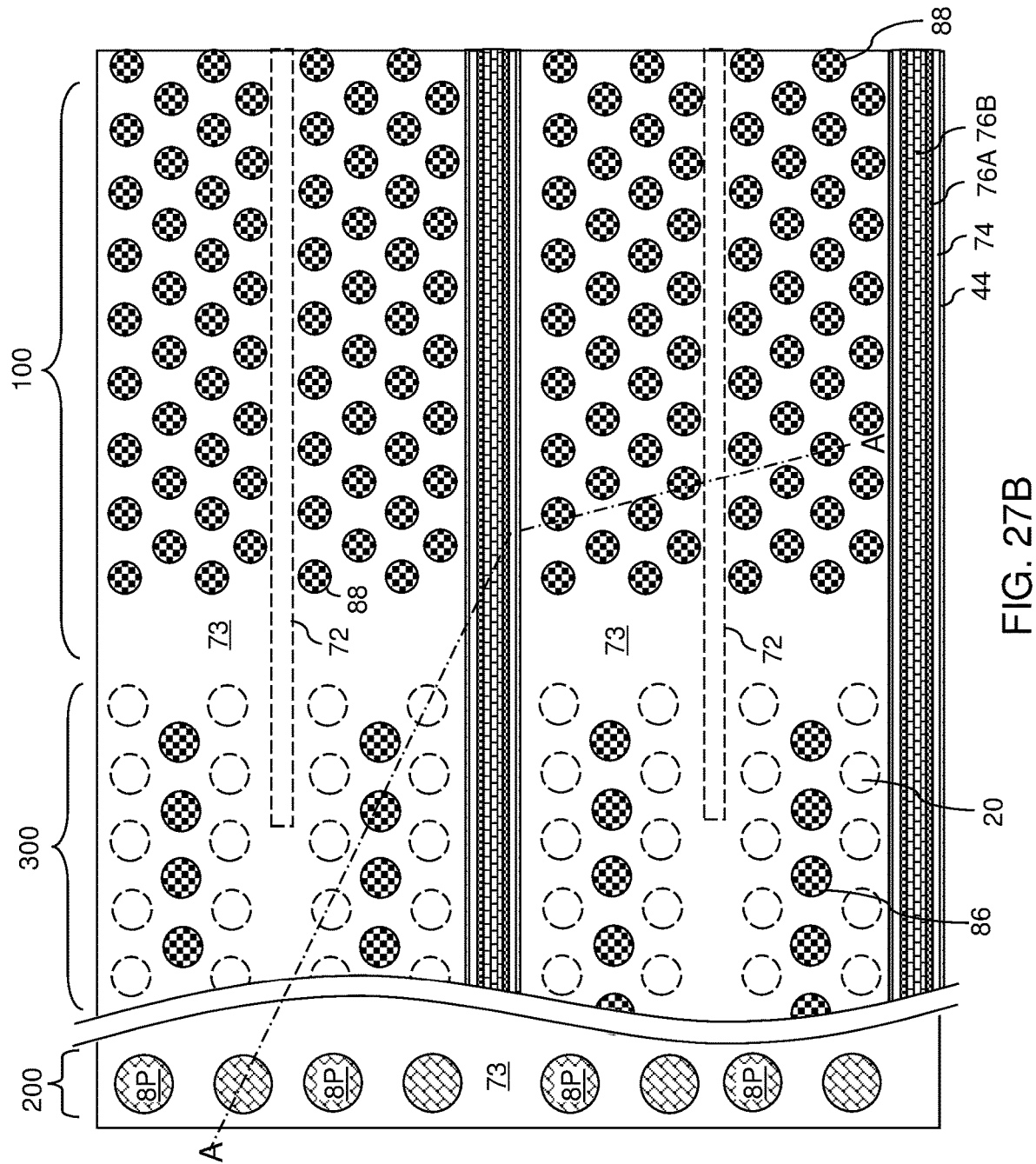
FIG. 27B is a partial see-through top-down view of the second exemplary structure of FIG. 27A. The vertical plane A-A' is the plane of the schematic vertical cross-sectional view of FIG. 27A.

Referring to FIGS. 27A and 27B, the processing steps of FIGS. 20A and 20B can be performed. Specifically, a contact-level dielectric layer 73 can be deposited over the insulating cap layer 70, the retro-stepped dielectric material portion 65, the memory opening fill structures 58, and the support pillar structures 20. Additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices.

According to the first embodiment of the present disclosure, a three-dimensional memory device comprises an alternating stack of insulating layers 32 and electrically conductive layers 46 located over a substrate (9, 10); memory openings 49 vertically extending through the alternating stack (32, 46); and memory opening fill structures 58 located within the memory openings 49, wherein each of the memory opening fill structures 58 comprises a respective vertical stack of memory elements (which may comprise portions of the memory material layers 54 located at levels of the electrically conductive layers 46), wherein each of the electrically conductive layers 46 comprises a metallic fill material layer 46B and a vertical tubular metallic liner (46C, 46D, and/or 46S) laterally surrounding a respective one of the memory opening fill structures. In the first embodiment, the vertical tubular metallic liner (46C, 46D, and/or 46S) is located between the metallic fill material layer 46B and the respective one of the memory opening fill structures 58.

The tubular metallic liner (46C, 46D, and/or 46S) may comprise a conductive metal oxide, a conductive metal oxynitride, a conductive metal nitride, a conductive metal boronitride, or elemental transition metal. In one embodiment, the metallic fill material layer 46B comprises tungsten or molybdenum; and the tubular metallic liner (46C, 46D, and/or 46S) comprises tungsten nitride, tungsten oxide, tungsten oxynitride, tungsten boronitride, molybdenum nitride, molybdenum oxide, molybdenum oxynitride, molybdenum boronitride, ruthenium or ruthenium oxide.

In the exemplary structure shown in FIGS. 18A to 19B, the tubular metallic liner (46D or 46S) is in direct contact with a vertical sidewall of the metallic fill material layer 46B and an outer sidewall of the respective one of the memory opening fill structures 58.

In the exemplary structures of FIGS. 13A to 16B, the device further comprises a conformal metallic liner 46A contacting at least one horizontal surface of the metallic fill material layer 46B. In one embodiment, the conformal metallic liner 46A comprises a conductive metallic nitride material and the tubular metallic liner has a different material composition than the conformal metallic liner. For example, the conformal metallic liner comprises a first conductive metallic nitride material; and the tubular metallic liner comprises a second conductive metallic nitride material including a different metallic element than the first conductive metallic nitride material. In one embodiment, the metallic fill material layer comprises tungsten or molybdenum; the conformal metallic liner comprises titanium nitride or tantalum nitride; and the tubular metallic liner comprises tungsten nitride, tungsten oxide, tungsten oxynitride, tungsten boronitride, molybdenum nitride, molybdenum oxide, molybdenum oxynitride, molybdenum boronitride, ruthenium or ruthenium oxide.

In the exemplary structures of FIGS. 13A-13H and 16A-16B, the conformal metallic liner 46A comprises an upper conformal metallic liner contacting a top surface of the metallic fill material layer 46B; and a lower conformal metallic liner contacting a bottom surface of the metallic fill material layer 46B and separated from the upper conformal metallic liner by the tubular metallic liner 46C which contacts a vertical sidewall of the metallic fill material layer 46B.

In the exemplary structures of FIGS. 14A-14B and 15A-15B, the conformal metallic liner 46A comprises a continuous conformal metallic liner that comprises an upper horizontally-extending metallic liner portion contacting a horizontal top surface of the metallic fill material layer; a lower horizontally-extending metallic liner portion contacting a horizontal bottom surface of the metallic fill material layer; and a vertically-extending metallic liner portion having a tubular configuration and vertically connecting the upper horizontally-extending metallic liner portion and the lower horizontally-extending metallic liner portion.

In the exemplary structure of FIGS. 14A-14B, the tubular metallic liner 46S contacts an outer sidewall of the respective one of the memory opening fill structures 58, and is laterally spaced from the metallic fill material layer 46B by the vertically-extending metallic liner portion of the continuous conformal metallic liner 46A.

In the exemplary structure of FIGS. 15A-15B, the vertically-extending metallic liner portion of the continuous conformal metallic liner 46A contacts an outer sidewall of the respective one of the memory opening fill structures 58, and is laterally spaced from the metallic fill material layer 46B by the tubular metallic liner 46D.

In the second embodiment illustrated in FIGS. 25A-25H, backside blocking dielectric layers 44 surround the respective electrically conductive layers 46 on at least three sides, and each of the electrically conductive layers 46 comprises a metallic fill material layer 46B and a vertical tubular metallic liner 46D laterally surrounding a respective one of the memory opening fill structures 58, and located between the metallic fill material layer 46B and a vertically-extending portion of the respective one of the backside blocking dielectric layers 44.

In one embodiment, the metallic fill material layer 46B and the vertical tubular metallic liner 46D contact a bottom surface and a top surface of the respective one of the backside blocking dielectric layers 44, while the vertical tubular metallic liner 46D contacts a vertical sidewall of the metallic fill material layer 46B and the vertically-extending portion of the respective one of the backside blocking dielectric layers 44. In one embodiment, each of the backside blocking dielectric layers 44 comprises an upper horizontally-extending backside blocking dielectric portion which contacts a bottom surface of an overlying one of the insulating layers 32; a lower horizontally-extending backside blocking dielectric portion which contacts a top surface of an underlying one of the insulating layer 32; and the vertically-extending portion which contacts an outer sidewall of the memory opening fill structures. The vertically-extending portion vertically connects the upper horizontally-extending backside blocking dielectric portion and the lower horizontally-extending backside blocking dielectric portion.

The various tubular metallic liners (46C, 46D, and/or 46S) can be employed to block fluorine diffusion from the word lines into the memory opening fill structures 58 with a reduced impact on word line conductivity because the liners extend only in the vertical direction and do not reduce the thickness of the word lines in the horizontal direction. The liners may also to reduce erase saturation due to interface between a dielectric metal oxide and boron atoms, to reduce nitridation of an elemental word line metal (such as molybdenum or other elemental metals that are prone to nitridation), intermixing of a barrier metal and a aluminum oxide blocking dielectric 52, and/or to optimize the work function of the word lines.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
an alternating stack of insulating layers and electrically conductive layers;
memory openings vertically extending through the alternating stack;
memory opening fill structures located within the memory openings, wherein each of the memory opening fill structures comprises a respective vertical stack of memory elements; and
backside blocking dielectric layers which surround the respective electrically conductive layers on at least three sides;
wherein each of the electrically conductive layers comprises a metallic fill material layer and a vertical tubular metallic liner laterally surrounding a respective one of the memory opening fill structures, and located between the metallic fill material layer and a vertically-extending portion of the respective one of the backside blocking dielectric layers, wherein the vertical tubular metallic liner lacks any horizontally-extending portion which extends in a horizontal direction along respective top and bottom surfaces of the insulating layers; and
wherein, for each of the electrically conductive layers, an outer periphery of a top surface of the tubular metallic liner is laterally offset outward from an inner periphery of the top surface of the tubular metallic liner by a lateral distance between an inner sidewall of the tubular metallic liner and an outer sidewall of the tubular metallic liner.

2. A three-dimensional memory device, comprising:
an alternating stack of insulating layers and electrically conductive layers;
memory openings vertically extending through the alternating stack;
memory opening fill structures located within the memory openings, wherein each of the memory opening fill structures comprises a respective vertical stack of memory elements; and
backside blocking dielectric layers which surround the respective electrically conductive layers on at least three sides;
wherein each of the electrically conductive layers comprises a metallic fill material layer and a vertical tubular metallic liner laterally surrounding a respective one of the memory opening fill structures, and located between the metallic fill material layer and a vertically-extending portion of the respective one of the backside blocking dielectric layers, wherein the vertical tubular metallic liner lacks any horizontally-extending portion which extends in a horizontal direction along respective top and bottom surfaces of the insulating layers; and
wherein, for each of the electrically conductive layers, an outer periphery of a bottom surface of the tubular metallic liner is laterally offset outward from an inner periphery of the bottom surface of the tubular metallic liner by a lateral distance between an inner sidewall of the tubular metallic liner and an outer sidewall of the tubular metallic liner.

* * * * *